US010198350B2

(12) United States Patent
Lee

(10) Patent No.: US 10,198,350 B2
(45) Date of Patent: *Feb. 5, 2019

(54) MEMORY MODULE HAVING VOLATILE AND NON-VOLATILE MEMORY SUBSYSTEMS AND METHOD OF OPERATION

(71) Applicant: Netlist, Inc., Irvine, CA (US)

(72) Inventor: Hyun Lee, Ladera Ranch, CA (US)

(73) Assignee: NETLIST, INC., Irvine, CA (US)

( * ) Notice: Subject to any disclaimer, the term of this patent is extended or adjusted under 35 U.S.C. 154(b) by 398 days.

This patent is subject to a terminal disclaimer.

(21) Appl. No.: 14/706,873

(22) Filed: May 7, 2015

(65) Prior Publication Data
US 2016/0019138 A1 Jan. 21, 2016

Related U.S. Application Data

(63) Continuation-in-part of application No. 14/536,588, filed on Nov. 7, 2014.
(Continued)

(51) Int. Cl.
*G06F 12/06* (2006.01)
*G06F 12/08* (2016.01)
(Continued)

(52) U.S. Cl.
CPC ...... *G06F 12/0246* (2013.01); *G06F 12/0638* (2013.01); *G06F 12/08* (2013.01);
(Continued)

(58) Field of Classification Search
CPC .. G06F 12/0246; G06F 12/0638; G06F 12/08; G11C 7/10
See application file for complete search history.

(56) References Cited

U.S. PATENT DOCUMENTS 2,043,099 A 2/1936 Hanna
3,562,555 A 2/1971 Ahrons
(Continued)

FOREIGN PATENT DOCUMENTS

CN 101563729 A 10/2009
CN 102723099 A 10/2012
(Continued)

OTHER PUBLICATIONS

Inter partes review Case No. IPR2017-00649, Exhibit 1010 "JEDEC Standard", filed Jan. 13, 2017.
(Continued)

*Primary Examiner* — Ann J Lo
*Assistant Examiner* — Michelle L Taeuber
(74) *Attorney, Agent, or Firm* — Morgan, Lewis & Bockius LLP

(57) ABSTRACT

A memory module comprises a volatile memory subsystem configured to coupled to a memory channel in computer system and capable of serving as main memory for the computer system, a non-volatile memory subsystem providing storage for the computer system, and a module controller coupled to the volatile memory subsystem, the non-volatile memory subsystem, and the C/A bus. The module controller reads first data from the non-volatile memory subsystem in response to a Flash access request received via the memory channel, and causes at least a portion of the first data to be written into the volatile memory subsystem in response to a dummy write memory command received via the C/A bus. The module control device includes status registers accessible by the computer system via the memory bus.

25 Claims, 14 Drawing Sheets

Related U.S. Application Data

(60) Provisional application No. 61/901,439, filed on Nov. 7, 2013, provisional application No. 61/929,942, filed on Jan. 21, 2014, provisional application No. 61/989,941, filed on May 7, 2014, provisional application No. 62/041,024, filed on Aug. 22, 2014, provisional application No. 62/056,469, filed on Sep. 26, 2014, provisional application No. 62/067,411, filed on Oct. 22, 2014, provisional application No. 62/150,272, filed on Apr. 20, 2015.

(51) Int. Cl.
*G06F 3/06* (2006.01)
*G11C 7/10* (2006.01)
*G06F 12/02* (2006.01)
*G06F 12/0871* (2016.01)
*G06F 13/10* (2006.01)
*G06F 13/28* (2006.01)
*G06F 12/0897* (2016.01)

(52) U.S. Cl.
CPC .......... *G06F 12/0871* (2013.01); *G06F 13/10* (2013.01); *G06F 13/28* (2013.01); *G11C 7/1072* (2013.01); *G06F 3/0656* (2013.01); *G06F 3/0688* (2013.01); *G06F 12/0897* (2013.01); *G06F 2206/1014* (2013.01); *G06F 2212/205* (2013.01); *G06F 2212/214* (2013.01); *G06F 2212/313* (2013.01); *G06F 2212/7201* (2013.01); *G06F 2212/7208* (2013.01)

(56) References Cited

U.S. PATENT DOCUMENTS

| | | |
|---|---|---|
| 3,916,390 A | 10/1975 | Chang et al. |
| 4,234,920 A | 11/1980 | Van Ness et al. |
| 4,420,821 A | 12/1983 | Hoffman |
| 4,449,205 A | 5/1984 | Hoffman |
| 4,965,828 A | 10/1990 | Ergott, Jr. et al. |
| 5,430,742 A | 7/1995 | Jeddeloh et al. |
| 5,519,663 A | 5/1996 | Harper, Jr. et al. |
| 5,519,831 A | 5/1996 | Holzhammer |
| 5,563,839 A | 10/1996 | Herdt et al. |
| 5,577,213 A | 11/1996 | Avery et al. |
| 5,619,644 A | 4/1997 | Crockett et al. |
| 5,675,725 A | 10/1997 | Malcolm |
| 5,758,149 A | 5/1998 | Bierma et al. |
| 5,870,350 A | 2/1999 | Bertin et al. |
| 5,874,995 A | 2/1999 | Naimpally et al. |
| 5,890,192 A | 3/1999 | Lee et al. |
| 5,953,215 A | 9/1999 | Karabatsos |
| 6,023,421 A | 2/2000 | Clinton et al. |
| 6,026,465 A | 2/2000 | Mills et al. |
| 6,065,092 A | 5/2000 | Roy |
| 6,112,310 A | 8/2000 | Jun et al. |
| 6,145,068 A | 11/2000 | Lewis |
| 6,158,015 A | 12/2000 | Klein |
| 6,199,142 B1 | 3/2001 | Saulsbury et al. |
| 6,216,247 B1 | 4/2001 | Creta et al. |
| 6,269,382 B1 | 7/2001 | Cabrera et al. |
| 6,336,174 B1 | 1/2002 | Li et al. |
| 6,336,176 B1 | 1/2002 | Leyda et al. |
| 6,421,279 B1 | 7/2002 | Tobita et al. |
| 6,459,647 B1 | 10/2002 | Kengeri |
| 6,487,102 B1 | 11/2002 | Halbert et al. |
| 6,487,623 B1 | 11/2002 | Emerson et al. |
| 6,571,244 B1 | 5/2003 | Larson |
| 6,614,685 B2 | 9/2003 | Wong |
| 6,658,507 B1 | 12/2003 | Chan |
| 6,691,209 B1 | 2/2004 | O'Connell |
| 6,721,860 B2 | 2/2004 | Klein |
| 6,769,081 B1 | 7/2004 | Parulkar |
| 6,799,241 B2 | 9/2004 | Kahn et al. |
| 6,799,244 B2 | 9/2004 | Tanaka et al. |
| 6,816,982 B2 | 11/2004 | Ravid |
| 6,944,042 B2 | 9/2005 | Komatsuzaki |
| 6,948,029 B2 | 9/2005 | Yano |
| 6,952,368 B2 | 10/2005 | Miura et al. |
| 7,053,470 B1 | 5/2006 | Sellers et al. |
| 7,062,618 B2 | 6/2006 | Tsunoda et al. |
| 7,089,412 B2 | 8/2006 | Chen |
| 7,102,391 B1 | 9/2006 | Sun et al. |
| 7,111,142 B2 | 9/2006 | Spencer et al. |
| 7,136,978 B2 | 11/2006 | Miura et al. |
| 7,155,627 B2 | 12/2006 | Matsui |
| 7,200,021 B2 | 4/2007 | Raghuram |
| 7,234,099 B2 | 6/2007 | Gower et al. |
| 7,353,325 B2 | 4/2008 | Lofgren et al. |
| 7,409,590 B2 | 8/2008 | Moshayedi et al. |
| 7,411,859 B2 | 8/2008 | Sohn et al. |
| 7,421,552 B2 | 9/2008 | Long |
| 7,409,491 B2 | 12/2008 | Doblar et al. |
| 7,467,251 B2 | 12/2008 | Park et al. |
| 7,600,142 B2 | 10/2009 | Ichikawa |
| 7,716,411 B2 | 5/2010 | Panabaker et al. |
| 7,818,488 B2 | 10/2010 | Park et al. |
| 8,086,955 B2 | 12/2011 | Zhou et al. |
| 8,102,614 B2 | 1/2012 | Song et al. |
| 8,233,303 B2 | 7/2012 | 8Est et al. |
| 8,301,833 B1 | 10/2012 | Chen et al. |
| 8,407,395 B2 | 3/2013 | Kim et al. |
| 8,412,879 B2 | 4/2013 | Chang et al. |
| 8,516,187 B2 | 8/2013 | Chen et al. |
| 8,671,243 B2 | 3/2014 | Chen et al. |
| 8,677,060 B2 | 3/2014 | Chen et al. |
| 8,874,831 B2 | 10/2014 | Lee et al. |
| 8,880,791 B2 | 11/2014 | Chen et al. |
| 8,904,098 B2 | 12/2014 | Amidi et al. |
| 8,904,099 B2 | 12/2014 | Chen et al. |
| 9,405,684 B1 | 8/2016 | Derbeko et al. |
| 2002/0083368 A1 | 6/2002 | Abe et al. |
| 2002/0199061 A1 | 12/2002 | Friedman et al. |
| 2003/0028733 A1 | 2/2003 | Tsunoda et al. |
| 2003/0158995 A1 | 8/2003 | Lee et al. |
| 2004/0010473 A1 | 1/2004 | Hsu et al. |
| 2004/0017630 A1 | 1/2004 | Akagi et al. |
| 2004/0088508 A1 | 5/2004 | Ballard et al. |
| 2004/0163027 A1 | 8/2004 | Maclaren et al. |
| 2004/0190210 A1 | 9/2004 | Leete |
| 2005/0044302 A1 | 2/2005 | Pauley et al. |
| 2005/0060488 A1 | 3/2005 | Poechmueller |
| 2005/0132250 A1 | 6/2005 | Hansen et al. |
| 2005/0141273 A1 | 6/2005 | Park et al. |
| 2005/0172074 A1 | 8/2005 | Sinclair |
| 2005/0249011 A1 | 11/2005 | Maeda |
| 2005/0273548 A1 | 12/2005 | Roohparvar |
| 2005/0280623 A1 | 12/2005 | Tani et al. |
| 2006/0039197 A1 | 2/2006 | Khouri et al. |
| 2006/0069896 A1 | 3/2006 | Sanders |
| 2006/0080515 A1 | 4/2006 | Spiers et al. |
| 2006/0212651 A1 | 9/2006 | Ashmore |
| 2006/0230032 A1 | 10/2006 | Brankov et al. |
| 2006/0294295 A1 | 12/2006 | Fukuzo |
| 2007/0070669 A1 | 3/2007 | Tsem |
| 2007/0130416 A1 | 6/2007 | Yada et al. |
| 2007/0136523 A1 | 6/2007 | Bonella et al. |
| 2007/0174602 A1 | 7/2007 | Kao |
| 2007/0192627 A1 | 8/2007 | Oshikiri |
| 2008/0080261 A1* | 4/2008 | Shaeffer ............... G11C 5/025 365/189.05 |
| 2008/0104344 A1 | 5/2008 | Shimozono et al. |
| 2008/0195806 A1 | 8/2008 | Cope |
| 2009/0031099 A1 | 1/2009 | Sartore |
| 2009/0113158 A1 | 4/2009 | Schnell et al. |
| 2009/0327578 A1 | 12/2009 | Cagno et al. |
| 2010/0110748 A1 | 5/2010 | Best |
| 2010/0188883 A1 | 7/2010 | Chen et al. |
| 2010/0274953 A1 | 10/2010 | Lee et al. |
| 2011/0211593 A1 | 9/2011 | Pepper et al. |
| 2011/0320804 A1 | 12/2011 | Chan et al. |
| 2012/0072683 A1 | 3/2012 | Iliadis |

(56) References Cited

U.S. PATENT DOCUMENTS

| | | | |
|---|---|---|---|
| 2012/0082018 | A1 | 4/2012 | Gushima et al. |
| 2012/0110036 | A1 | 5/2012 | Rabii |
| 2012/0204079 | A1 | 8/2012 | Takefman et al. |
| 2012/0215965 | A1 | 8/2012 | Inada et al. |
| 2012/0254504 | A1 | 10/2012 | Syu et al. |
| 2012/0271990 | A1 | 10/2012 | Chen et al. |
| 2012/0278543 | A1 | 11/2012 | Yu et al. |
| 2013/0013853 | A1* | 1/2013 | Yeh .................. G06F 12/0246 711/103 |
| 2013/0019076 | A1 | 1/2013 | Amidi et al. |
| 2013/0086309 | A1 | 4/2013 | Lee et al. |
| 2013/0254456 | A1 | 9/2013 | Chen et al. |
| 2013/0254497 | A1 | 9/2013 | Chen et al. |
| 2013/0286737 | A1* | 10/2013 | Im ...................... G11C 5/02 365/185.11 |
| 2013/0346671 | A1* | 12/2013 | Michael ............ G06F 12/0246 711/103 |
| 2014/0059170 | A1 | 2/2014 | Gasparakis et al. |
| 2014/0108702 | A1 | 4/2014 | Mizushima |
| 2014/0156919 | A1 | 6/2014 | Chen et al. |
| 2014/0156920 | A1 | 6/2014 | Chen et al. |
| 2014/0189202 | A1 | 7/2014 | Hosaka |
| 2014/0223068 | A1 | 8/2014 | Shaeffer et al. |
| 2014/0229669 | A1* | 8/2014 | Sandstrom ............ G06F 3/0613 711/112 |
| 2014/0244923 | A1 | 8/2014 | Ware |
| 2014/0269088 | A1* | 9/2014 | Pichen ................ G06F 13/1626 365/185.18 |
| 2015/0003175 | A1* | 1/2015 | Ramanujan ........ G11C 14/0009 365/189.17 |
| 2015/0052114 | A1 | 2/2015 | Curewitz et al. |

FOREIGN PATENT DOCUMENTS

| | | | |
|---|---|---|---|
| EP | 0428330 | A2 | 5/1991 |
| EP | 1051994 | A | 6/1991 |
| EP | 2737383 | A2 | 6/2014 |
| WO | WO2008/139441 | A2 | 11/2008 |
| WO | WO 2012/148812 | A2 | 11/2012 |
| WO | WO2013016723 | A3 | 1/2013 |

OTHER PUBLICATIONS

Inter partes review Case No. IPR2017-00649, Exhibit 1012 "1.8 Volt Intel StrataFlash Wireless Memory (L18)", filed Jan. 13, 2017.
Inter partes review Case No. IPR2017-00649, Exhibit 1003 "Declaration of Ron Maltiel Regarding U.S. Pat. No. 8,301,833", filed Jan. 13, 2017.
Inter partes review Case No. IPR2017-00649, Exhibit 1017 "Computer Organization & Design", filed Jan. 13, 2017.
Inter partes review Case No. IPR2017-00649, Exhibit 1023 "Designing Embedded Hardware", filed Jan. 13, 2017.
Inter partes review Case No. IPR2017-00649, Exhibit 1014 "JEDEC Standard Double Data Rate (DDR) SDRAM Specification JESD79", filed Jan. 13, 2017.
Inter partes review Case No. IPR2017-00649, Exhibit 1020 "Microsoft Computer Dictionary Fifth Edition", filed Jan. 13, 2017.
Inter partes review Case No. IPR2017-00649, Exhibit 1021 "Microsoft Windows 2000 Professional Resource Kit", filed Jan. 13, 2017.
Inter partes review Case No. IPR2017-00649, Exhibit 1024 "A 1.8-V 128-Mb 125-MHz Multilevel Cell Flash Memory With Flexible Read While Write", filed Jan. 13, 2017.
Inter partes review Case No. IPR2017-00649, Petition for Inter Partes Review of U.S. Pat. No. 8,301,833 filed Jan. 13, 2017.
Inter partes review Case No. IPR2017-00692, Exhibit 1003 "Declaration of Ron Maltiel Regarding U.S. Pat. No. 8,874,831", filed Jan. 17, 2017.
Inter partes review Case No. IPR2017-00692, Petition for Inter Partes Review of U.S. Pat. No. 8,874,831, filed Jan. 17, 2017.
Inter partes review Case No. IPR2017-00649, Exhibit 1006 "U.S. Appl. No. 60/749,267", filed Jan. 13, 2017.
Inter partes review Case No. IPR2017-00692, Exhibit 1007 "U.S. Appl. No. 60/912,321", filed Jan. 17, 2017.
Inter partes review Case No. IPR2017-00692, Exhibit 1005 "U.S. Appl. No. 60/941,586", filed Jan. 17, 2017.
International Search Report and Written Opinion in PCT/US2014/064698, dated Aug. 14, 2015.
International Search Report and Written Opinion in PCT/US12/48750, dated Oct. 10, 2012.
Notice of Allowance in U.S. Appl. No. 12/240,916, dated Sep. 17, 2012.
Office Action in U.S. Appl. No. 12/240,916, dted Feb. 1, 2012.
Office Action in U.S. Appl. No. 12/240,916, dated Jul. 29, 2011.
Notice of Allowance in U.S. Appl. No. 13/536,176, dated Aug. 4, 2014.
Amendment and Reply to Office Action in U.S. Appl. No. 13/536,173, dated May 21, 2013.
Notice of Allowance in U.S. Appl. No. 13/536,173, dated Jul. 2, 2013.
Office Action in U.S. Appl. No. 12/240,916, dated Feb. 1, 2012.
Advisory Action in U.S. Appl. No. 12/240,916, dated Mar. 13, 2012.
Office Action in U.S. Appl. No. 12/240,916, dated Apr. 3, 2012.
Office Action in U.S. Appl. No. 13/536,173, dated Apr. 15, 2013.
Office Action in U.S. Appl. No. 13/905,048, dated Aug. 1, 2013.
Notice of Allowance in U.S. Appl. No. 13/559,476, dated May 6, 2014.
International Preliminary Report on Patentability in PCT/US12/48750, dated Apr. 3, 2014.
Office Action in U.S. Appl. No. 13/625,563, dated Aug. 5, 2013.
Office Action in U.S. Appl. No. 13/625,563, dated May 9, 2014.
Office Action in U.S. Appl. No. 13/905,053, dated Aug. 1, 2013.
Office Action in U.S. Appl. No. 14/173,219, dated Mar. 13, 2014.
Office Action in U.S. Appl. No. 14/173,242, dated Mar. 14, 2014.
Notice of Allowance in U.S. Appl. No. 14/489,269, dated Oct. 8, 2015.
Inter Partes Review of U.S. Pat. No. 8,874,831, Case No. IPR2017-00692, Exhibit 1017 "JESD79-2B", filed Jan. 17, 2017.
Inter Partes Review of U.S. Pat. No. 8,874,831, Case No. IPR2017-00692, Patent Owner's Preliminary Response, filed May 1, 2017.
Inter Partes Review of U.S. Pat. No. 8,874,831, Case No. IPR2017-00692, Exhibit 2001, Excerpts from Microsoft Dictionary Fifth Edition (2002), filed May 1, 2017.
Inter Partes Review of U.S. Pat. No. 8,874,831, Case No. IPR2017-00692, Exhibit 2002, Excerpts from the New Oxford Dictionary Second Edition (2005), filed May 1, 2017.
Inter Partes Review of U.S. Pat. No. 8,874,831, Case No. IPR2017-00692, Exhibit 2003, Excerpts from Merriam-Webster's Collegiate Dictionary Eleventh Edition (2003), filed May 1, 2017.
Inter Partes Review of U.S. Pat. No. 8,874,831, Case No. IPR2017-00692, Trial Instituted Document, filed Jul. 21, 2017.
Inter Partes Review of U.S. Pat. No. 8,874,831, Case No. IPR2017-00692, Patent Owner's Objections to Evidence, Filed Aug. 4, 2017.
Inter Partes Review of U.S. Pat. No. 8,874,831, Case No. IPR2017-00692, Patent Owner's Notice of Deposition of Ron Maltiel, filed Aug. 30, 2017.
Inter Partes Review of U.S. Pat. No. 8,874,831, Case No. IPR2017-00692, Patent Owner's Response, Filed Nov. 10, 2017.
Inter Partes Review of U.S. Pat. No. 8,874,831, Case No. IPR2017-00692, Exhibit 2005 Excerpts from Memory Systems (Jacob), Filed Nov. 10, 2017.
Inter Partes Review of U.S. Pat. No. 8,874,831, Case No. IPR2017-00692, Exhibit 2010 Deposition transcript of Ron Maltiel, Filed Nov. 10, 2017.
Inter Partes Review of U.S. Pat. No. 8,874,831, Case No. IPR2017-00692, Exhibit 2011 Stanford's Materials Science department website, Filed Nov. 10, 2017.
Inter Partes Review of U.S. Pat. No. 8,874,831, Case No. IPR2017-00692, Exhibit 2012 Webpage from Ben-Gurion University's Materials Science department website, Filed Nov. 10, 2017.
Inter Partes Review of U.S. Pat. No. 8,874,831, Case No. IPR2017-00692, Exhibhit 2013 Search on Amazon website for "memory module", Filed Nov. 10, 2017.

(56) References Cited

OTHER PUBLICATIONS

Inter Partes Review of U.S. Pat. No. 8,874,831, Case No. IPR2017-00692, Exhibit 2014 Kingston press release from Oct. 11, 2005, Filed Nov. 10, 2017.
Inter Partes Review of U.S. Pat. No. 8,874,831, Case No. IPR2017-00692, Exhibit 2015 Decision of the U.S. Court of Appeals Case No. 2016-1742, Filed Nov. 10, 2017.
Inter Partes Review of U.S. Pat. No. 8,874,831, Case No. IPR2017-00692, Exhibit 2019 IPR2017-00649, paper 7, denying institution, filed Nov. 10, 2017.
Inter Partes Review of U.S. Pat. No. 8,874,831, Case No. IPR2017-00692, Exhibit 2020 IPR2017-00649, paper 8, rehearing request, Filed Nov. 10, 2017.
Inter Partes Review of U.S. Pat. No. 8,874,831, Case No. IPR2017-00692, Exhibit 2021 IPR2014-00882, Paper 33, FWD, Filed Nov. 10, 2017.
Inter Partes Review of U.S. Pat. No. 8,874,831, Case No. IPR2017-00692, Exhibit 2022 JEDEC Standard, JESD205 (2007), Filed Nov. 10, 2017.
Inter Partes Review of U.S. Pat. No. 8,874,831, Case No. IPR2017-00692, Exhibit 2023 Deposition transcript of Dr. Mazumder (IPR2017-00560, -561, -562), Filed Nov. 10, 2017.
Inter Partes Review of U.S. Pat. No. 8,874,831, Case No. IPR2017-00692, Exhibit 2024 M-Systems DiskOnChip Millennium Plus Data Sheet, Filed Nov. 10, 2017.
Inter Partes Review of U.S. Pat. No. 8,874,831, Case No. IPR2017-00692, Exhibit 2025 Excerpts from Merriam-Webster's (2006), Filed Nov. 10, 2017.
Inter Partes Review of U.S. Pat. No. 8,874,831, Case No. IPR2017-00692, Exhibit 2026 Excerpts from Memory Systems (Jacob), Filed Nov. 10, 2017.
Inter Partes Review of U.S. Pat. No. 8,874,831, Case No. IPR2017-00692, Petitioner's Objections to Evidence, Filed Nov. 17, 2017.
U.S. District Court Northern District of California, Case No. 4:13-CV-05889-YGR, *Netlist, Inc. v. Smart Storage Systems, Inc., and Diablo Technologies, Inc.*, Smart Storage Systems, Inc.'s Invalidity Contentions, dated Jun. 6, 2014.
U.S. District Court Northern District of California, Case No. 4:13-CV-05889-YGR, *Netlist, Inc. v. Smart Storage Systems, Inc., and Diablo Technologies, Inc.*, Exhibits C.1-C.7 to "Smart Storage Systems, Inc.'s Invalidity Contentions," dated Jun. 6, 2014.
U.S. District Court Northern District of California, Case No. 4:13-CV-05889-YGR, *Netlist, Inc. v. Smart Storage Systems, Inc., and Diablo Technologies, Inc.*, Exhibits D.1-D.8 to "Smart Storage Systems, Inc.'s Invalidity Contentions," dated Jun. 6, 2014.
U.S. District Court Northern District of California, Case No. 4:13-CV-05889-YGR, *Netlist, Inc. v. Smart Storage Systems, Inc., and Diablo Technologies, Inc.*, Exhibit H to "Smart Storage Systems, Inc.'s Invalidity Contentions," dated Jun. 6, 2014.
U.S. District Court Northern District of California, Case No. 4:13-CV-05889-YGR, *Netlist, Inc. v. Smart Storage Systems, Inc., and Diablo Technologies, Inc.*, Diablo Technologies, Inc.'s Invalidity Contentions, dated Jun. 6, 2014.
U.S. District Court Northern District of California, Case No. 4:13-CV-05889-YGR, *Netlist, Inc. v. Smart Storage Systems, Inc., and Diablo Technologies, Inc.*, Exhibits E-1 to E-7 to "Diablo Technologies, Inc.'s Invalidity Contentions," dated Jun. 6, 2014.
U.S. District Court Northern District of California, Case No. 4:13-CV-05889-YGR, *Netlist, Inc. v. Smart Storage Systems, Inc., and Diablo Technologies, Inc.*, Exhibits B-1 to B-7 to "Diablo Technologies, Inc.'s Invalidity Contentions," dated Jun. 6, 2014.
U.S. District Court Northern District of California, Case No. 4:13-CV-05889-YGR, *Netlist, Inc. v. Smart Storage Systems, Inc., and Diablo Technologies, Inc.*, Exhibit H to "Diablo Technologies, Inc.'s Invalidity Contentions," dated Jun. 6, 2014.
Inter Partes Review U.S. Pat. No. 8,301,833, IPR Case No. IPR2014-01370, Corrected Petition for Inter Partes Review, filed on Sep. 22, 2014.
Inter Partes Review Case No. IPR2014-01370, Exhibit 1002 to Petition for Inter Partes Review, "Declaration of Dr. Nader Bagherzadah," filed on Aug. 23, 2014.
Inter Partes Review Case No. IPR2014-01370, Exhibit 1017 "Webster's II New College Dictionary," filed on Sep. 22, 2014.
Inter Partes Review Case No. IPR2014-01370, Patent Owner's Preliminary Response, filed on Dec. 18, 2014.
Inter Partes Review Case No. IPR2014-01370, Patent Owner's Exhibit List, filed on Dec. 18, 2014.
Inter Partes Review Case No. IPR2014-01370, Decision—Denying Institution of Inter Partes Review 37 C.F.R. 42.108, issued Mar. 13, 2015.
Inter Partes Review Case No. IPR2014-01370, Exhibit 2002 to Petition for Inter Partes Review, "Standard Dictionary of Electrical and Electronics Terms," IEEE 1988, filed on Aug. 23, 2014.
Inter Partes Review of U.S. Pat. No. 8,516,187, IPR Case No. IPR2014-01371, Corrected Petition for Inter Partes Review, filed on Sep. 22, 2014.
Inter Partes Review Case No. IPR2014-01371, Exhibit 1005 to Petition for Inter Partes Review, "The BIOS Optimization Guide Rev. 6.2," Adrian Wong 1988, filed on Aug. 23, 2014.
Inter Partes Review Case No. IPR2014-01371, Exhibit 1006 to Petition for Inter Partes Review, "JEDEC Standard No. 21-C Release 9," JEDEC Solid State Technology Association, Aug. 1999, filed Aug. 23, 2014.
Inter Partes Review Case No. IPR2014-01371, Exhibit 1010 to Petition for Inter Partes Review, "MPC8560 PowerQUICC III Compact Flash Interface Design," Freescale Semiconductor Application Note, Dec. 2006, filed Aug. 23, 2014.
Inter Partes Review Case No. IPR2014-01371, Patent Owner's Preliminary Response, filed on Dec. 18, 2014.
Inter Partes Review Case No. IPR2014-01371, Patent Owner's Exhibit List, filed on Dec. 18, 2014.
Inter Partes Review Case No. IPR2014-01371, Decision—Denying Institution of Inter Partes Review 37 C.F.R. 42.108, issued on Mar. 13, 2015.
JEDEC Global Standards for the Microelectronics Industry, Standards http://www.jedec.org/standards-documents/about-jedec- standards (2014).
JEDEC Standard No. 21-C (Release 17), Annex J: Serial Presence Detects for DDR2 SDRAM (Rev. 1.3).
Inter Partes Review Case No. IPR2014-00982, Petition for Inter Partes Review of U.S. Pat. No. 8,516,187, filed on Jun. 19, 2014.
Inter Partes Review Case No. IPR2014-00982, Patent Owner's Preliminary Response, filed Sep. 26, 2014.
Inter Partes Review Case No. IPR2014-00982, Decision—Denying Institution of Inter Partes Review 37 C.F.R. 42.108, issued Dec. 22, 2014.
Inter Partes Review Case No. IPR2014-00982, Rehearing Request, filed Jan. 15, 2015.
Inter Partes Review Case No. IPR2014-00982, Decision Denying Request for Rehearing, issued May 21, 2015.
Inter Partes Review Case No. IPR2014-00982, Exhibit 1013 to Petition for Inter Partes Review, "Declaration of Dr. Paul Min," filed on Jun. 19, 2014.
Inter Partes Review of U.S. Pat. No. 8,516,187, IPR Case No. IPR2014-00994, Petition for Inter Partes Review, filed on Jun. 20, 2014.
Inter Partes Review Case No. IPR2014-00994, Patent Owner's Preliminary Response, filed on Oct. 2, 2014.
Inter Partes Review Case No. IPR2014-00994, Decision—Denying Institution of Inter Partes Review—37 CFR 42.108, issued Dec. 16, 2014.
Inter Partes Review Case No. IPR2014-00994, Rehearing Request, filed on Jan. 15, 2015.
Inter Partes Review Case No. IPR2014-00994, Decision Denying Request for Rehearing, issued May 21, 2015.
JEDEC Standard 21-C, "Configurations for Solid State Memories," pp. 4.5.5-1 to 4.5.5-18.
Diablo Technologies, Inc.'s Invalidity Contentions, Case No. 13-CV-05889 YGR, dated Jun. 6, 2014.
Smart Storage Systems, Inc's Invalidity Contentions, Case No. 4:13-cv-05889-YGR, dated Jun. 6, 2014.

(56) References Cited

OTHER PUBLICATIONS

JEDEC Standard, "Configurations for Solid State Memories", JEDEC Standard 21-C, Release 9, Aug. 1999,114 pages.
Wong, A. "The BIOS Optimization Guide", Adrian's Rojak Pot, Rev. 6.2, 1998-2001, 67 pages.
American National Standard Dictionary of Electrical and Electrical Terms, IEEE, Fourth Edition, Revised, ANSIIEEE Std 100-1988, Institute of Electrical Engineers, Nov. 3, 1988, pp. 215, 722, 964 and 1103.
Webster's II New College Dictionary, Houghton Mifflin Company, Boston, MA, 2001, pp. 259, 1115.
Bruce, J., "Synchronous DRAM Architectures, Organizations, and Alternate Technologies", Electrical and Computer Engineering Dept., Univ. of Maryland, Dec. 10, 2002, 22 pages.
David, H. et al., "Fully Buffered DIMM (FB-DIMM) Design Considerations", Intel Developer Forum, Intel Corp., Feb. 18, 2004, 36 pages.
Horowitz, P. et al., "The Art of Electronics", Cambridge University Press 2nd Ed. 1989, pp. 471,495-496.
Innis, J., "MPC8560 PowerQUICC III Compact Flash Interface Design", Freescale Semiconductor, Inc., 2004-2006, pp. 1-23.
Jacob, B., "Memory Systems Cache, RAM, Disk", Morgan Kaufman Publishers, Burlington, MA, 2008, Preface and Ch. 7 pp. 315-322.
Jandhyala, S. et al., "Design-For-Test Analysis of a Buffered SDRAMIMM", Semiconductor Group, Texas Instruments, Proceedings of International Workshop in Memory Technology, Design and Testing, Singapore, Aug. 13014, 1996,15 pages.
JEDEC Standard, Double Data Rate (DDR): SDRAM Specification: JESD79C (Revision JESD79B), Mar. 2003, pp. 1-75.
JEDEC Standard, FBDIMM Specification:DR2 SDRAM Fully Buffered DIMM (FBDIMM) Design Specification: JESD205, JEDEC Solid State Tech. Assoc., Mar. 2007, pp. 1-129.
Mutnuary, B. et al., "Analysis of Fully Buffered DIMM Interface in High-speed Server Applications", IBM Corp, xSeries eServer Development, 2006 Electronic Components and Technology Conference, pp. 203-208.
Petition for Inter Partes Review of U.S. Pat. No. 8,516,187 (on behalf of SanDisk, Corp.), filed Jun. 19, 2014.
Petition for Inter Partes Review of U.S. Pat. No. 8,301,833 (on behalf of SanDisk, Corp.), filed Jun. 20, 2014.
"Using Two Chip Selects to Enable Quad Rank", an IP.com Prior Art Database Technical Disclosure, IP.com Electronic Publication: Dec. 17, 2005, 2 pages.
Petition for Inter Partes Review of U.S. Pat. No. 8,516,187 (on behalf of SMART Modular Technologies, Inc.), filed Aug. 22, 2014.
Petition for Inter Partes Review of U.S. Pat. No. 8,301,833 (on behalf of SMART Modular Technologies, Inc.), filed Aug. 22, 2014.
"Out of Stealth Mode, Start-Up MetaRAM Unveils New Technology That Quadruples DRAM Capacity", Press Release edited by Storage Newsletter on Feb. 28, 2008 at StorageNewsLetter.com, 8 pages.
"MetaRAM Develops New Technology That Quadruples Memory Capacity of Servers and Workstations; Reduces Price by Up to 90 Percent", Press Release provided by MetaRAM and published on MarketWired.com, Feb. 25, 2008, 3 pages.
"240pin DDR2 MetaSDRAM Registered DIMM based on 1 GB version C", Hynix Semiconductor, Product Description Rev. 0.2, Sep. 2008, 32 pages.
Lco, Office Action U.S. Appl. No. 14/536,588, dated Aug. 25, 2016 21 pgs.
Lee, Office Action, U.S. Appl. No. 14/536,588, dated Jun. 20, 2017, 27 pgs.
Lee, Final Office Action, U.S. Appl. No. 14/536,588, dated Jun. 8, 2018, 37 pgs.
Lee, Final Office Action, U.S. Appl. No. 14/834,395, dated May 22, 2018, 27 pgs.
Lee, Final Office Action, U.S. Appl. No. 14/834,395, dated Jul. 25, 2017, 22 pgs.
Lee, Office Action, U.S. Appl. No. 15/616,246, dated Jun. 28, 2018, 16 pgs.
Micron Technology Inc., NAND Flash Memory, data sheet, © 2005, 58 pgs.
Netlist, Inc., Communication Pursuant to Article 94(3), EP14860330-1, dated Apr. 19, 2018, 8 pgs.
Netlist, Inc., Extended European Search Report, EP14860330-1, dated Jun. 30, 2017, 16 pgs.
Netlist, Inc., International Search Report and Written Opinion, PCT/US2016/026874, dated Aug. 12, 2016, 9 pgs.
Netlist, Inc., International Preliminary Report on Patentability, PCT/US2016/026874, dated Oct. 24, 2017, 8 pgs.

\* cited by examiner

MEMORY MODULE HAVING VOLATILE AND NON-VOLATILE MEMORY SUBSYSTEMS AND METHOD OF OPERATION

CROSS REFERENCE TO RELATED APPLICATIONS

The present application is a continuation-in-part of U.S. patent application Ser. No. 14/536,588, filed Nov. 7, 2014, entitled "Hybrid Memory Module and System and Method of Operating the Same," which is incorporated herein by reference in its entirety. The present application also claims priority to U.S. Provisional Patent Application No. 61/989,941, filed May 7, 2014, entitled "High Density Hybrid Memory Systems," U.S. Provisional Patent Application No. 62/041,024, filed Aug. 22, 2014, entitled "Apparatus and Methods for Transferring Storage Content," U.S. Provisional Patent Application No. 62/056,469, filed Sep. 26, 2014, entitled "Memory Channel Storage," U.S. Provisional Patent Application No. 62/067,411, filed Oct. 22, 2014, entitled "Hybrid Mobile Memory for Random Access," and U.S. Provisional Patent Application No. 62/150,272, filed Apr. 20, 2015, entitled "Hybrid Memory Module for Computer System," each of which is incorporated herein by reference in its entirety. The present application is related to U.S. Provisional Patent Application No. 61/512,871, filed Jul. 28, 2011, entitled "High Density DIMMs," and U.S. patent application Ser. No. 13/559,476, filed Jul. 26, 2012, entitled "Flash DRAM Hybrid Memory Module," each of which is incorporated herein by reference in its entirety.

FIELD

The disclosure herein is related generally to memory modules, and more particularly to memory modules having both volatile and non-volatile subsystems, and system and method of operating the same.

BACKGROUND

Computer systems such as network servers, personal computers, PDAs, mobile phones, video games, scientific instruments, industrial robotics, medical electronics, and so on, rely heavily on the capacity and throughput of their system or main memories and the speed of accessing them for optimal performance. Currently, dynamic random-access memory (DRAM) is commonly used as system memory. DRAM is a type of random-access memory that stores each bit of data in a separate capacitor in an integrated circuit. The capacitor can be either charged or discharged so that these two states are taken to represent the two values of a bit, conventionally called 0 and 1. Since capacitors leak charge, the information eventually fades unless the capacitor charge is refreshed periodically. Because of this refresh requirement, it is a dynamic memory as opposed to SRAM and other static memory.

The structural simplicity of DRAM allows DRAM chips to reach very high densities, because billions of transistor and capacitor pairs can fit on a single memory chip. On the other hand, DRAM is volatile memory—it loses its data quickly when power is removed. Compared to Flash memory, which is a type of electronic non-volatile computer storage medium that can be electrically erased and reprogrammed, DRAM is also much more expensive. For example, high density DRAM can cost as much as 20 times more than high-performance Flash devices. Furthermore, Flash chips can have much higher density than DRAM chips, allowing a same-sized memory module to pack much more to reach a much larger memory capacity.

DESCRIPTION OF THE EMBODIMENTS

Figure 1:
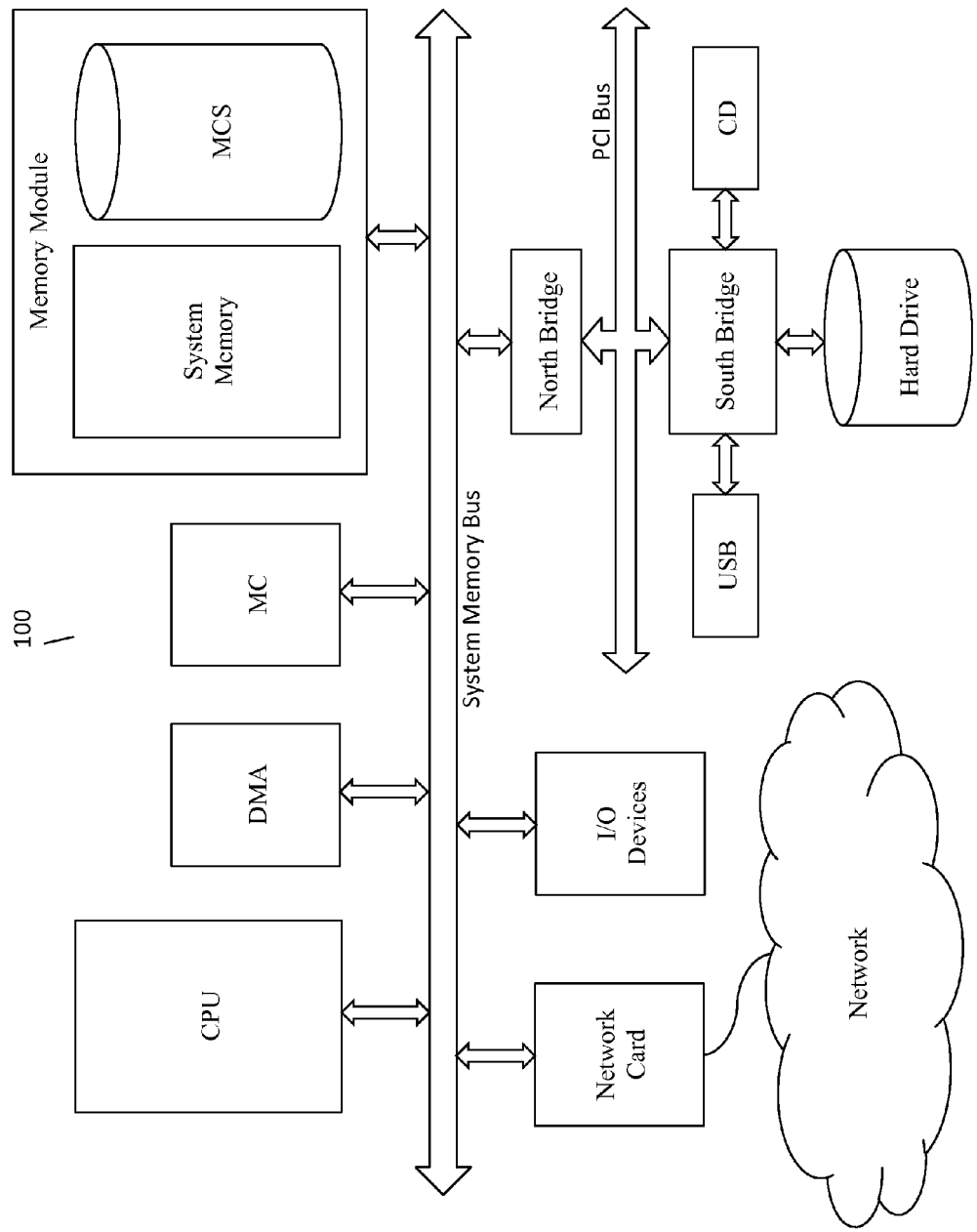
FIG. 1 is a block diagram of a computer or server system according to certain embodiments.

As shown in FIG. 1, a computer or server system (computer system) 100 according to certain embodiments includes a central processing unit (CPU) or processor, a memory controller (MC), a system memory bus, one or more memory modules coupled to the memory controller via the system memory bus. The one or more memory modules include one or more Hypervault™ (HV) memory modules that provide a system memory, and may further provide memory channel storage (MCS). In certain embodiments, the MC may be integrated into the CPU. In further embodiments, the computer system may also include a direct data management controller (DMA) also coupled to the system bus. The CPU with or without the MC and/or the DMA, or the computer system 100 in part or in while, is sometimes referred to hereafter as the "System" or "system."

In certain embodiments, the computer system 100 may further include a network card and one or more I/O devices such as keyboard, monitor, touchscreen, microphone, speaker, etc. The network card may or may not be integrated into the CPU and provides network interface functions (wired or wireless) between the computer system 100 and local and/or wide area networks. The computer system 100 may further include a PCI bus, which is coupled to a north bridge, which is coupled to the memory controller via the memory bus or incorporated into the memory controller. One or more storage devices, such as a hard drive, a CD/DVD drive, and a USB drive, via a south bridge are coupled to the PCI bus.

Figure 2:
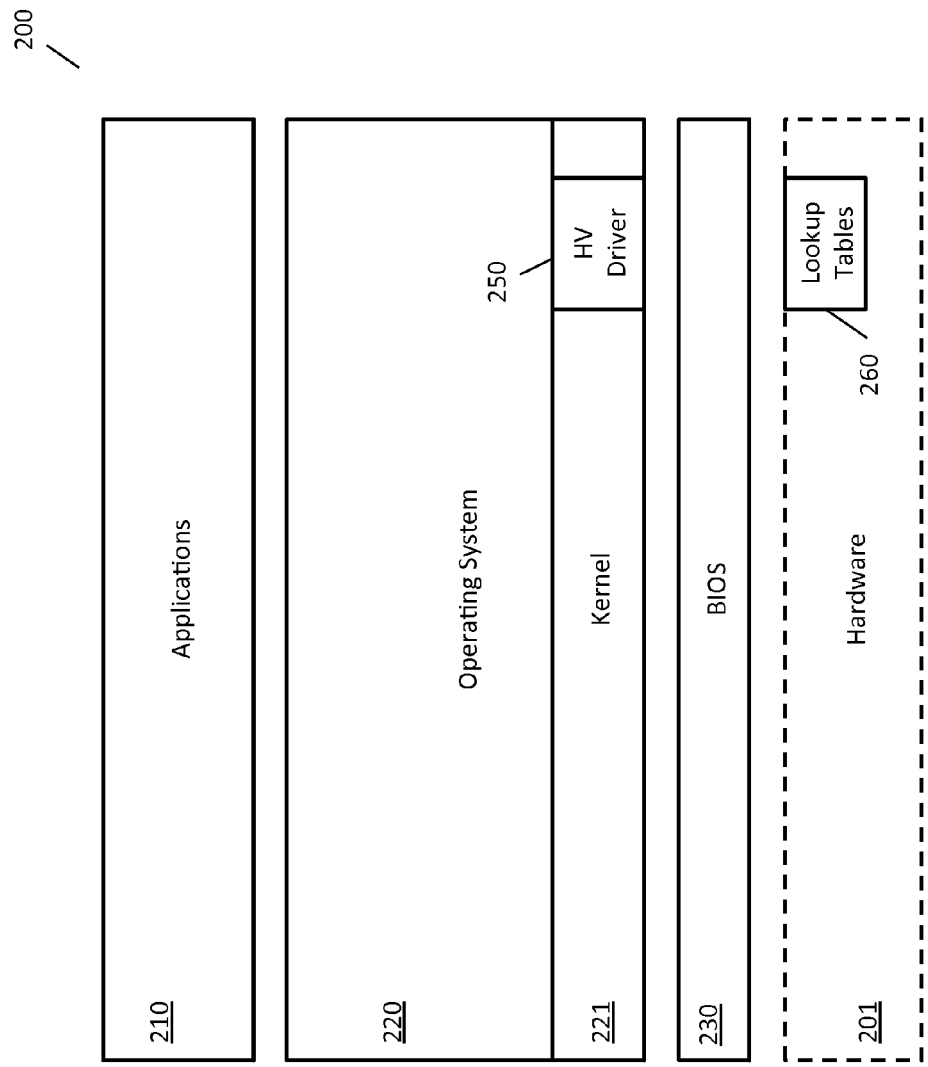
FIG. 2 is a block diagram of a software stack of the computer or server system according to certain embodiments.

In addition to the hardware components shown in FIG. 1, the computer system 100 also includes software/firmware components. In certain embodiments, the software/firmware components can be roughly represented as a stack of software/firmware layers 200 over a hardware layer 201. As shown in FIG. 2, the stack of software/firmware layers 200 includes an applications layer 210 sitting on an operating system layer 220. The applications 210 are software programs that perform specific tasks. The operating system 220 manages the hardware and software resources of the computer system 100 and acts as an intermediary between the application programs 210 and the hardware components of the computer system 100.

The operating system 220 includes a kernel 221, which are computer programs that manages input/output requests from other software programs (or processes), and which translates the requests into data processing instructions for the CPU and/or other hardware components of the computer system 100. The kernel can include an interrupt handler that handles all requests or completed I/O operations that compete for the kernel's services, a scheduler that determines which programs share the kernel's processing time in what order, and a supervisor that actually gives use of the computer to each process when it is scheduled. The kernel may also include a manager of the operating system's address spaces in memory or storage. The kernel's services are requested by other parts of the operating system or by applications through a specified set of program interfaces sometimes referred to as system calls.

Between the kernel and the hardware layer is the basic input/output system (BIOS) layer 230, which in certain embodiments is firmware stored in some sort of permanent memory (e.g., programmable read-only memory (PROM), or electrically programmable read-only memory (EPROM)), or Flash memory, and includes program codes for initializing and testing the system hardware components, and to load the operating system from a mass memory device when the computer system 100 is boot up. The BIOS may additionally provide an abstraction layer for the hardware components so as to provide a consistent way for application programs and operating systems to interact with the hardware components such as the system memory and input/output devices.

In certain embodiments, the software stack further includes an HV driver 250 in, for example, the kernel. The HV driver 250 is a software program for controlling system access to the HV memory module so that the HV memory module can operate like a standard Dual In-Line Memory Module (DIMM), such as Double Data Rate (DDR) 3 registered DIMM (RDIMM), or DDR3 Load Reduction DIMM (LRDIMM), DDR4 RDIMM, or DDR4 LRDIMM, without requiring any changes to the BIOS. The HV driver 250 has access to a memory space 260 in the CPU and certain memory locations used to store lookup tables or other configuration information, which the HV driver 250 can consult with and/or update as needed. In certain embodiments, the driver intercepts certain system calls to access the HV memory module and directs the memory controller to send control, address and data signals in response to the system calls and in compliance with the memory interface standard the system is using (e.g., the Joint Electron Device Engineering Council (JEDEC) DDR3 or DDR4 RDIMM or LRDIMM Standard), as discussed in further detail below.

Figure 3:
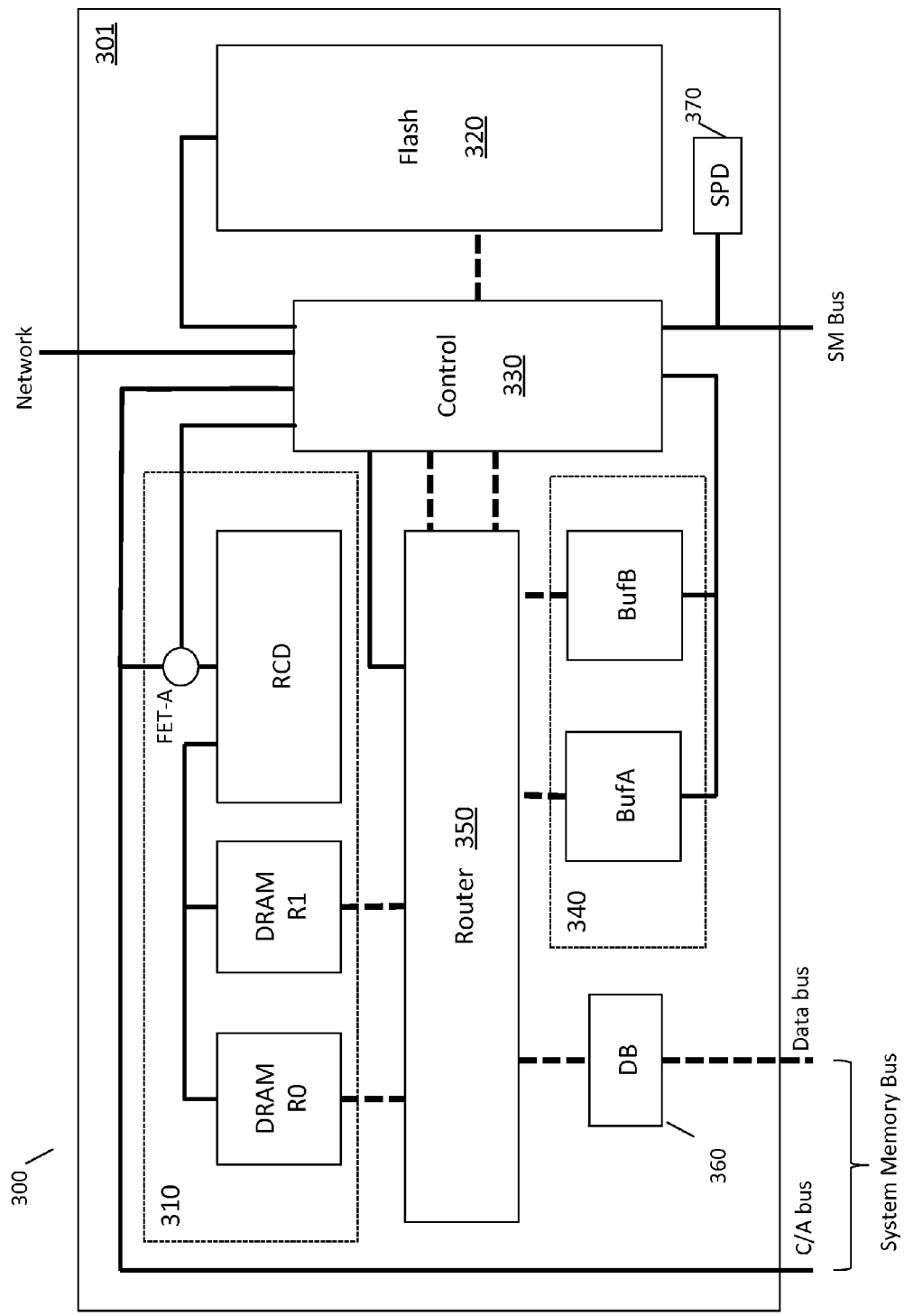
FIG. 3 is a block diagram of a memory module having both DRAM an Flash memory according to certain embodiments.

FIG. 3 is a block diagram of a Hypervault™ dual-in-line memory module (HVDIMM) 300, which can be used to provide the system memory and/or the MCS of the computer/server system 100 according to certain embodiments. As shown in FIG. 3, the HVDIMM 300 includes a volatile memory subsystem (HV-DRAM) 310, a non-volatile memory subsystem (HV-Flash 320) 320, and a module control subsystem (HV Control) 330, mounted on a module board 301, which may include one or more printed circuit boards. The HVDIMM 300 may also include buffer memory 340, and may also include a network interface controller (HV-NIC). The HVDIMM 300 may also include a data routing or router circuit 350 including, for example, switching circuits (e.g., Field-effect transistor or FET switches) and/or multiplexors, that selectively routes data signals between the HV-DRAM 310 and the system memory bus, the HV-DRAM 310 and HV Control 330, the HV-DRAM 310 and the buffer memory 340, the buffer memory 340 and the HV Control 330, and/or the buffer memory 340 and the system memory bus, under the control of the HV Control 330. The HVDIMM may further includes data buffer circuitry 360 that buffers read/write data between the system and the HVDIMM 300. The HVDIMM 300 further includes data signal lines (as represented by the dashed lines) and control/address (C/A) signals lines (as represented by the solid lines).

As shown in FIG. 3, the HVDIMM 300 is coupled to the system memory bus and may be further coupled to a system management (SM) bus using, for example, the I²C protocol or a variant thereof. The system memory bus includes control/address (C/A) signal lines and data/strobe (DQ/DQS) signal lines. The C/A signal lines are coupled to the register control device (RCD) in the HV-DRAM 310 during normal operations, and are further coupled to the HV Control 330. Thus, both the RCD and the HV Control 330 may respond to C/A signals from the system. In certain embodiments, the HV-DRAM 310 further includes a switching circuit (e.g., an FET switch, FET-A), which can be controlled by the HV Control 330 to couple the RCD to either the C/A bus and the HV Control 330 such that the HV-DRAM 310 either responds to C/A signals from the system during, for example, normal operations when the system accesses the DRAM address spaces in the HVDIMM 300, or to C/A signals from the HV Control 330 during, for example, backup/restore operations when the HVDIMM 300 backs up the content in the HV-DRAM 310 after a power failure or restore the content back into the DRAM after power is resumed.

In certain embodiments, the HV Control 330 is configured to monitor the C/A signals from the memory controller and to recognize and act upon C/A signals formulated in response to system calls to access the HV-Flash 320 and/or the buffer memory 340.

In certain embodiments, the buffer memory 340 includes DRAM, such as terabyte DRAM memory (TBM), or SRAM. The buffer memory 340 is used to temporarily store data so as to make data transfers in the buffer memory 340 faster and more efficient. Since normally data may be transferred in and out of Flash memory at a slower speed than data is transferred to and from the system, the buffer memory 340 is used to buffer data to/from the Flash memory so the system does not have to slow down and wait for data to be written to or read from the HV-Flash 320. When the system writes data to the HV-Flash 320, the data is buffered into the buffer memory 340 at DRAM data I/O speed, which is much faster than Flash data I/O speed. The buffered data can be written into the Flash memory on, for example, First-in First-out (FIFO) basis. The same is true for the read direction. Thus, while reading from the HV-Flash 320, the CPU can engage in other processes with the main memory until the buffer memory 340 has buffered a predetermined amount of data for transferring to the main memory or the system at the DRAM speed. On the other hand, when data is transferred from the main memory to the storage, the data is read from the HV-DRAM 310 according to a set of control/address (C/A) signals from the system or the HV Control 330, and written into the buffer memory 340 according to another set of C/A signals from the HV Control 330. While the DRAM can be engaged with the system on other tasks, the HV Control 330 can transfer the data from the buffer memory 340 to the HV-Flash 320 by reading the data from the buffer memory 340 and writing the data to the storage. In further embodiments, the buffer memory 340 may include two sets of buffer memory, BufA and BufB.

In certain embodiments, the HV-DRAM 310 may include multiple ranks (e.g., DRAM R1 and DRAM R2) of double data rate (e.g., DDR3 or DDR4) DRAM devices and a register control device (RCD). In certain embodiments, the HV-Flash 320 includes MLC NAND Flash, which are partitioned to support fast access as well as enhance the error correction capability for virtual duplication. In certain embodiments, the HV-FLASH 320 includes a number of (e.g., 9) standard embedded multi-media card (eMMC) packages each having an embedded multi-media interface, as described in U.S. patent application Ser. No. 14/536,588, filed Nov. 7, 2014, entitled "Hybrid Memory Module and System and Method of Operating the Same," which is incorporated herein by reference.

In certain embodiments, the HVDIMM 300 further includes a serial presence detect (SPD) device 370 accessible by the system via the SM bus. The SPD device 370 includes non-volatile memory such as electrically erasable and programmable read only memory (EEPROM) for storing therein key parameters of the HVDIMM 300, such as basic memory type, module data widths, timing parameters, memory density (e.g., size of each bank), manufacturer ID, serial number, etc. These key parameters are generally written by the manufacturers. During system boot up, the BIOS reads the SPD information to configure the memory controller.

The components in the HVDIMM 300, e.g., the HV Control 330, the main memory subsystem (or volatile memory subsystem), the buffer memory 340, the HV-Flash 320 (or non-volatile memory subsystem), can be mounted on a same printed circuit board or disposed in close proximity to each other to allow fast and smooth data transfer therebetween.

Figure 4:
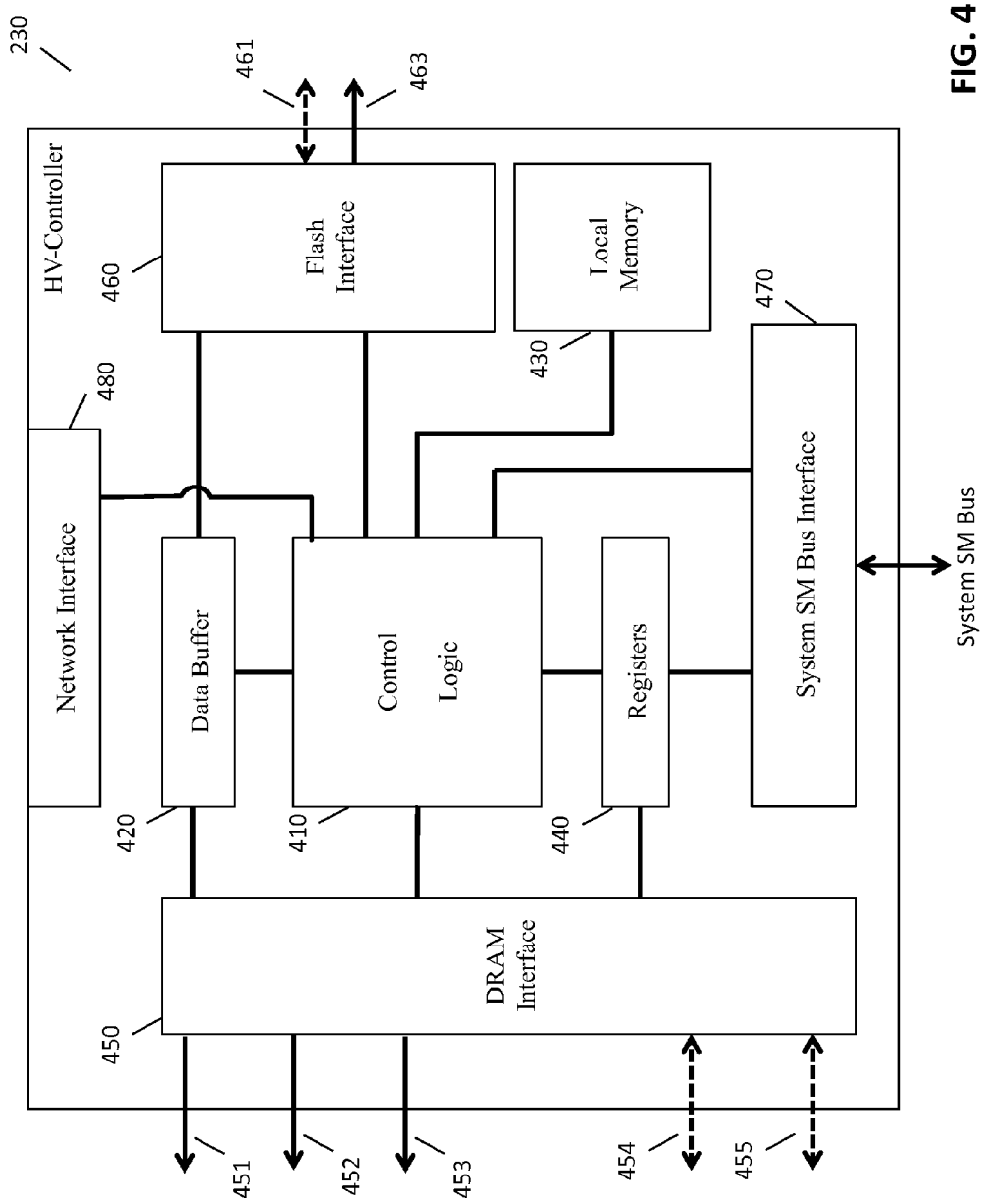
FIG. 4 is a block diagram of a module controller in the memory module according to certain embodiments.

FIG. 4 is a block diagram of the HV Control 330 according to certain embodiments. The HV Control 330 can be implemented using one or more application-specific integrated circuits (ASIC) and/or programmable field gate array (FPGA) devices. As shown in FIG. 4, the HV Control 330 includes control logic 410, a data buffer 420, local memory 430 and registers 440. The HV Control 330 further includes a DRAM interface 450, a Flash interface 460, a system management Bus interface 470, and a network interface 480. In certain embodiments, the HV Control 330 controls data transfers between the HV-DRAM 310 and HV-Flash 320. It keeps an address management table in the local memory on-chip memory space, operates the router 350 and the switching circuit FET-A, and generates proper commands and address signals to the HV-DRAM 310, HV-Flash 320 and the buffer memory 340 to control the data transfers therebetween.

In certain embodiments, the Flash interface is coupled to the HV-FLASH 320 via data signal lines 461 and control/address signals lines 463, the DRAM interface 450 provides multiple sets of C/A signal lines to control different DRAMs on the memory module 300 at the same time. For example, the C/A signal lines 451 is used to transmit C/A signals to the HV-DRAM 310 during backup/restore operations, and, when both BufA and BufB are provided in the buffer memory 340, C/A signal lines 452 is used to transmit C/A signals to BufA in the buffer memory 340, and the C/A signal lines 453 is used to transmit C/A signals to BufB in the buffer memory 340, so that BufA and BufB can be involved in different data transfer activities concurrently. The DRAM interface 450 also provides multiple sets of DQ/DQS signal lines (e.g., 454 and 455) that are coupled to the router 350 so that the HV Control 330 can handle multiple data transfers concurrently. For example, while data is being transferred between BufB and the HV-FLASH 320, the HV Control 330 can perform error correction on data buffered in BufA.

In certain embodiments, the HVDIMM 300 can be operated to back up data in the DRAM in response to power failure events. The HV Control 330 provides correct timings for HV-DRAM 310 to be operated in an DLL-off mode when data in the DRAM is being transferred to the Flash. The HV Control 330 also provides proper operational procedure for the back-up and restore processes. The switching circuit, FET-A, can be configured to isolate the RCD 320 and to allow the RCD 320 to receive C/A signals from the HV Control 330 during the back-up and restore processes. The HV Control 330 also controls the router 350 to route data from the HV-DRAM 310 to the HV Control 330 during backup operations and to route data from the HV Control 330 to the HV-DRAM 310 during restore operations.

In certain embodiments, the system can access the HVDIMM 300 via the SM bus. For example, the system can use the SM bus to configure the HV Control 330 by setting certain registers in the HV Control 330. The HV Control 330 can also use the SM bus to notify the system when certain operation is completed or when an error is encountered, either using a preconfigured interrupt signal, or by updating a predefined status register in the system bus interface of the HV Control 330, or in the DMA.

In certain embodiments, the HV Control 330 also manages network interfaces between the HVDIMM 300 and any local or wide-area networks in conjunction with HV-NIC so as to facilitate direct data transfers between the HVDIMM 300 and other storage devices in the local or wide-area networks. In certain embodiments, the HV Control 330 includes a network interface and/or is coupled to a network interface card (HV-NIC), which can take the data from the HV-DRAM 310 and/or HV-Flash 320, and constructs network packets with proper source and destination addresses. In general, the source address is pre-configured by the system. In certain embodiments, the HV-NIC or network interface and some or all of the other components of the HV Control 330 can be embedded into a same ASIC or FPGA.

Figure 5:
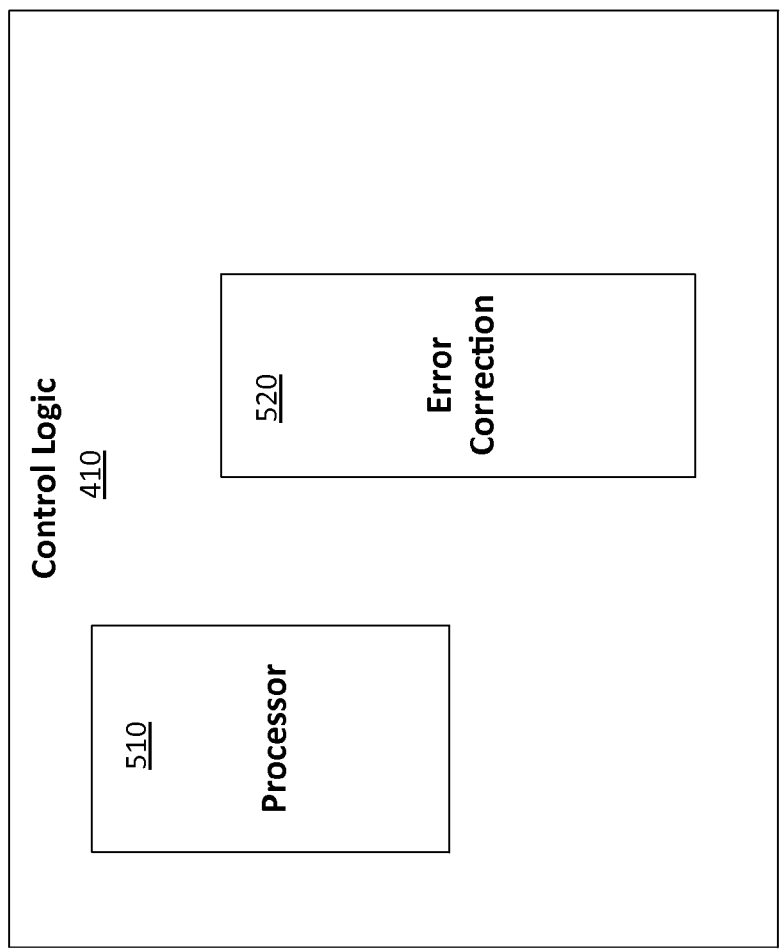
FIG. 5 is a block diagram of a control logic circuit in the module controller according to certain embodiments.

In certain embodiments, as shown in FIG. 5, the control logic 410 includes logic circuits and/or one or more processing units or processors 510 that monitors the C/A signals from the system, generates the C/A signals for the HV-DRAM 310 and/or the buffer memory 340 coupled to the DRAM interface 450 and/or the C/A signals for the HV-Flash 320 coupled to the Flash interface 460, and controls the router 350 and the switching circuit FET-A, in response to the C/A signals from the system. In certain embodiments, the logic circuits and/or processors can be configured to pre-process data being transferred from the Flash to the DRAM, so as to save DRAM memory space and reduce data traffic in the memory channel by off-loading some of the computing work traditionally done by the CPU, as described in U.S. Provisional Patent Application No. 62/041,024, filed Aug. 22, 2014, entitled "Apparatus and Methods for Transferring Storage Content," which is incorporated herein by reference. In certain embodiments, the HV Control 330 also includes an error correction circuit 520 executing error detection/correction routines to insure the integrity of data transferred from the HV-Flash, as described in U.S. patent application Ser. No. 14/536,588, filed Nov. 7, 2014, entitled "Hybrid Memory Module and System and Method of Operating the Same," which is incorporated herein by reference.

Figure 6:
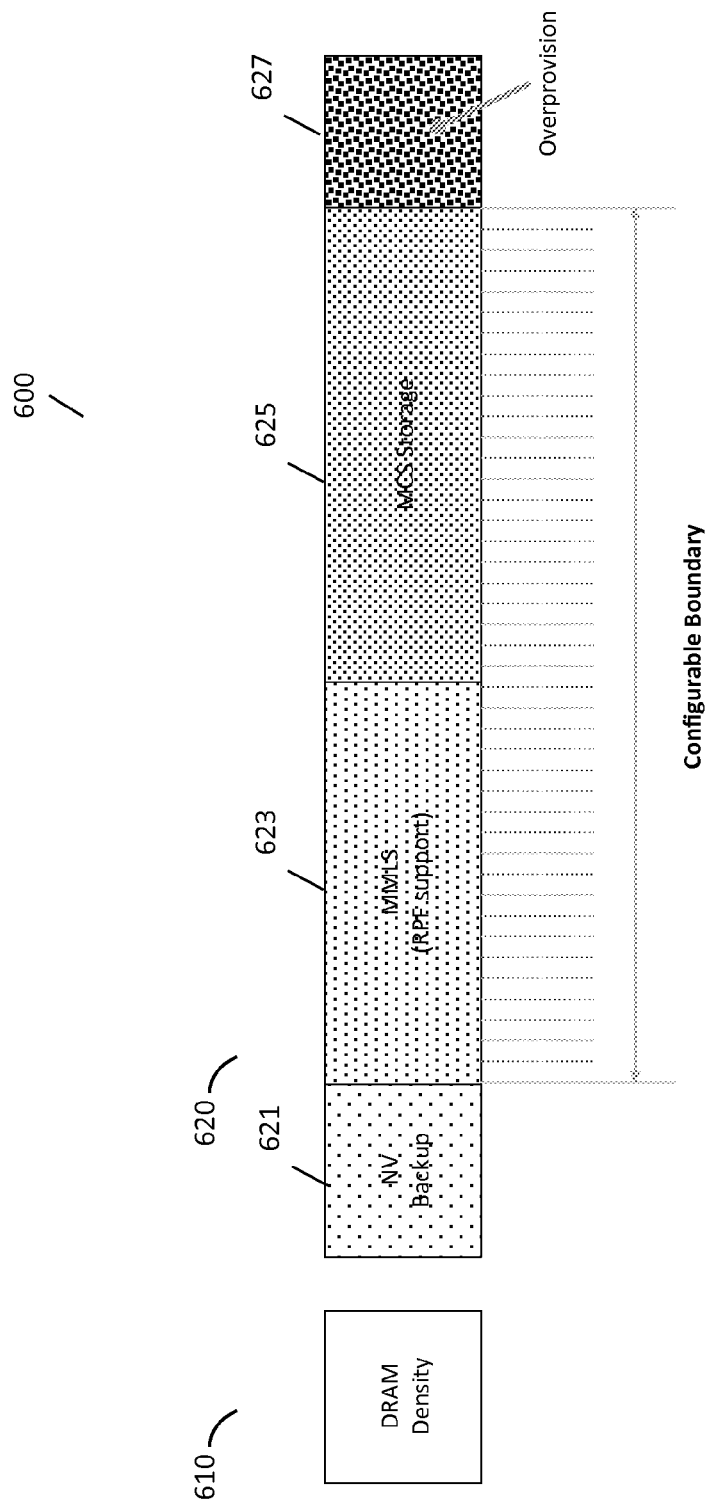
FIG. 6 is block diagram illustrating a physical memory address space of the memory module according to certain embodiments.

FIG. 6 illustrates a memory space 600 provided by the HVDIMM 300 according to certain embodiments. As shown in FIG. 6, the memory space 600 includes a HV-DRAM space 610 and a HV-FLASH space 620. The HV-Flash space 620 is partitioned into a plurality of areas, including a non-volatile (NV) backup area 621, a main memory local storage (MMLS) area 623, an MCS Storage area 625, etc. each of which can be used to support a different function of the HV memory. For example, the NV backup area can be used to store a copy of the content in the HV-DRAM during power outage; and the MMLS area can be used as a swap space, and/or to function as part or all of the main memory. In certain embodiments, working data for random access by the system is stored in DRAM data format in the MMLS area. The MCS area can be used as traditional Flash storage. In certain embodiments, the memory space in the Flash memory also includes an overprovision area, which provides extra storage capacity. In certain embodiments, the overprovision area is hidden from the system and is used to improve performance by distributing writes and erases across a larger population.

The HV-DRAM space 610 includes the physical memory space for random access by the system. This space can be shared by multiple processes or applications running on the system 100. In order to manage the memory space 610 efficiently, the system 100 may provide an abstraction of its main memory known as virtual memory or virtual address space, which maps memory addresses used by a program (i.e., virtual addresses, into physical addresses in the HV-DRAM 310. To implement virtual memory, the system 100 may include a memory management unit (MMU) that keeps track of the pages and their address translations. When a running program tries to access data in a memory page that is mapped into the virtual address space of the system, but not loaded in the physical memory provided by the HV-DRAM 310, a page fault occurs, and the system may raise an interrupt, which prompts the HV driver 250 to handle the page fault by causing the memory module 300 to move the requested data from the HV-FLASH 320 to the HV-DRAM 310, so as to allow the program to continue operation as if the page fault had not occurred.

In certain embodiments, for operations involving the HV-Flash 320 or buffer memory 340, such as a swap-in or swap-out operation, the HV driver 250 sends a Flash access request to the memory controller when it needs to transfer data between DRAM (main memory) and Flash (storage) and provides the DRAM and the Flash addresses with this request. Afterwards, the HV driver 250 and the HV Control 330 work together to move data in or out of the HV-DRAM 310 without causing conflict with normal system accesses to the main memory. In certain embodiments, the memory controller may interleave the storage accesses with normal system memory accesses.

Figure 7:
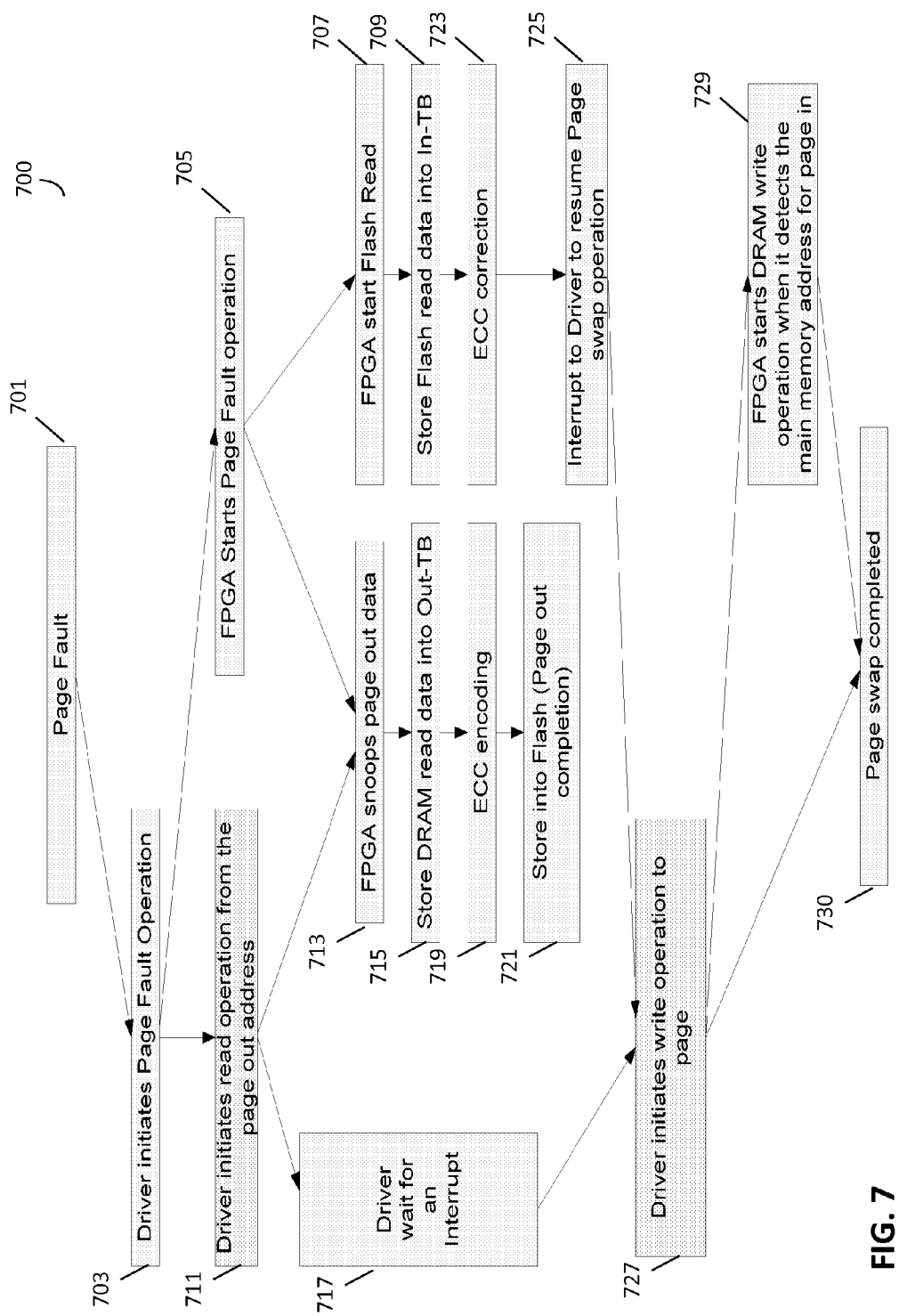
FIG. 7 is a flowchart of data transfers in response to a page fault in the computer or server system according to certain embodiments.
Figure 8:
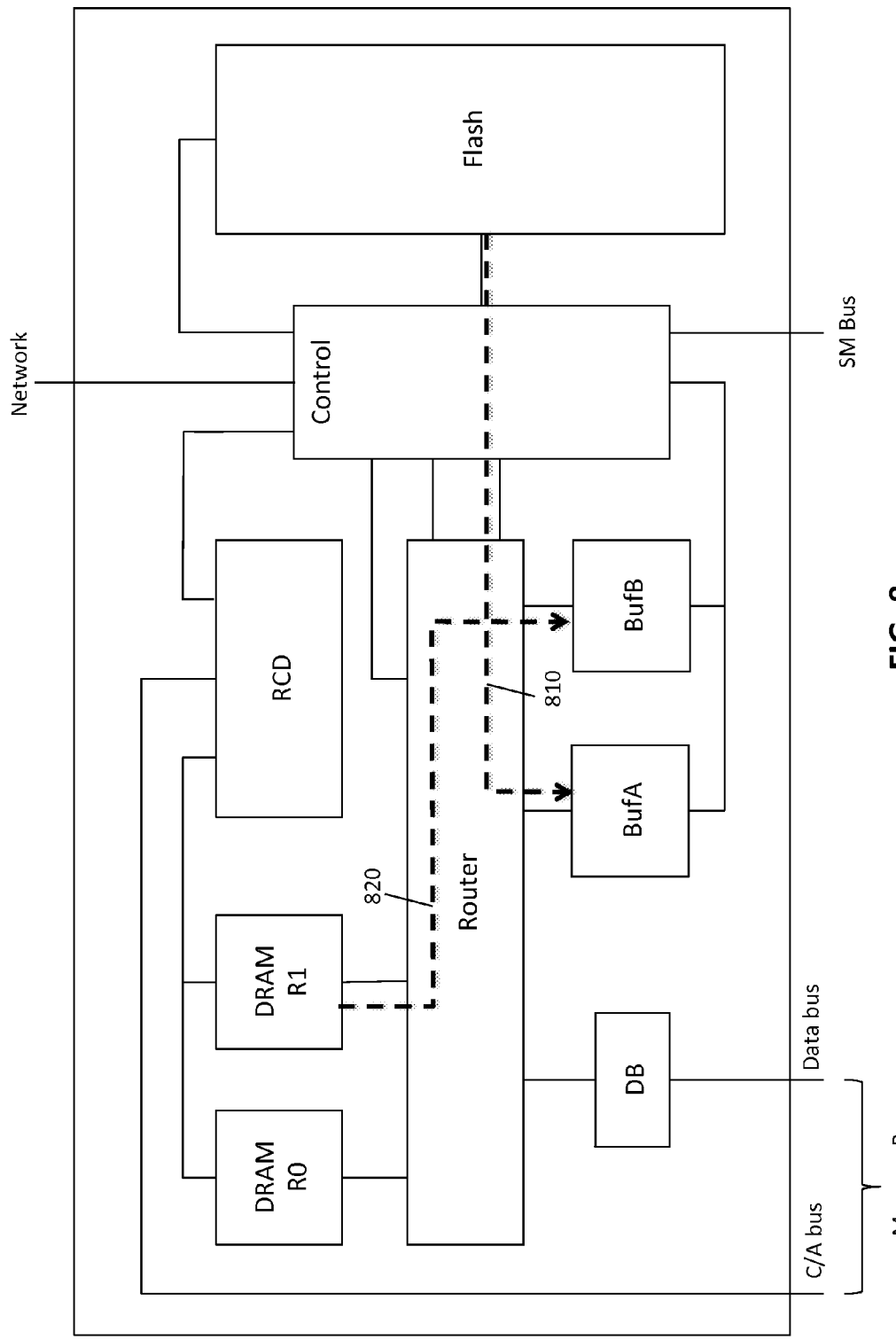
FIGS. 8-10 are diagrams illustrating various data transfers on the memory module according to certain embodiments.

For example, FIGS. 7-10 illustrate a process 700 carried out by the HV driver 250 and the HV Control 330 in response to a page fault 701. As shown in FIG. 7, the HV driver 250 initiates a page-fault operation (703) by causing the memory controller to send a first set of C/A signals via the C/A bus to the HVDIMM 300 and a first set of data signals associated with the first set of C/A signals via the data bus to the HVDIMM 300. In certain embodiment, the first set of C/A signals includes a write command that is not directed at the HV-DRAM 310. For example, the C/A signals may include one or more chip select signals, none of which is asserted to select any of the ranks in the HV-DRAM 310. The first set of data signals include further information for the page fault operation such as one or more address locations in the HV-FLASH where the requested data is to be retrieved. The HV Control 330 recognizes the first set of C/A signals and starts the page fault operation on the DIMM (705) by directing the router 350 to route the first data signal to the HV Control 330 instead of the HV-DRAM 310. The HV Control 330 then starts Flash reads (707) by generating Flash C/A signals based on the first set of C/A signals and based on the first data signal received from the memory controller, causing the HV-Flash to output page-in data that is to be loaded in DRAM. The HV Control 330 can cause the page-in data to be stored in BufA (709) by directing the router 350 to form a data path 810, as shown in FIG. 8, and sends a set of C/A signals to BufA ahead of the page-in data according to the timing requirements of the memory devices in BufA.

Concurrently, the HV driver 250 continues to handle the page fault operation. The HV driver 250 may swap some data out of the HV-DRAM 310 to make space for the memory page that is to be loaded in DRAM. In certain embodiments, the HV driver 250 does this by causing the memory controller to send a second set of C/A signals including a read command and a read address (711), which causes the HV-DRAM to output page-out data. The second set of C/A signals are received by both the RCD and the HV Control 330. The HV Control 330 recognizes the second set of C/A signals as being part of the page fault operation because the read address is related to the address in the first set of C/A signals. In response, the HV Control 330 snoops the page-out data (713) by directing the router 350 to form a data path 820 (as shown in FIG. 8) to route the page-out data into BufB. The HV Control 330 also causes the page-out data to be written into BufB (715) by sending a set of C/A signals to BufB ahead of the page-out data according to the timing requirements of the memory devices in BufB. The data may also be routed directly to the HV Control 330 and written to BufB afterwards.

Figure 9:
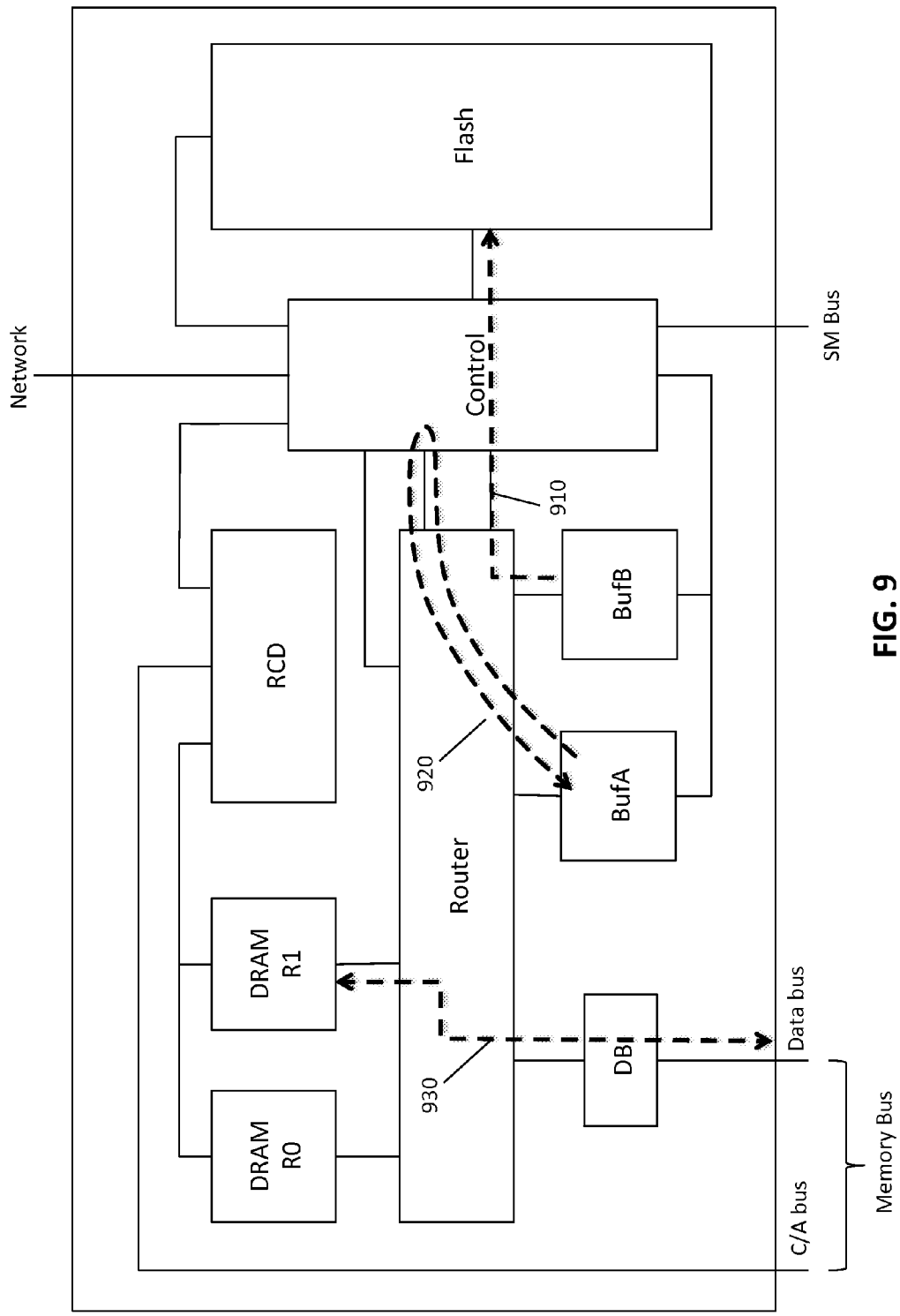

The HV driver 250 now waits (717) as the HVDIMM 300 continues the data transfers discussed above. In certain embodiments, the HV Control 330 may add error correction codes (ECC) to the page-out data (719), as discussed in U.S. patent application Ser. No. 14/536,588, filed Nov. 7, 2014, entitled "Hybrid Memory Module and System and Method of Operating the Same," which is incorporated herein by reference. In certain embodiments, ECC coding is done as the page-out data is being transferred to the HV-FLASH 320 via a data path 910 through the HV Control 330, as shown in FIG. 9. The HV Control 330 also sends Flash C/A signals to cause the ECC encoded page-out data to be stored in the HV-Flash (721). In certain embodiments, the HV Control 330 manages HV-Flash 320 addresses and keeps track of physical Flash addresses in relation to virtual/physical addresses known to the system. This can be done by creating and updating an address-mapping table, which maps the system (virtual/physical) addresses to the Flash physical addresses. HV Control 330 uses the address-mapping table to correctly place page-out data into proper locations in HV-FLASH 320.

The HV Control 330 may perform error correction on the page-in data read out from the HV-Flash (723), as discussed in U.S. patent application Ser. No. 14/536,588, filed Nov. 7, 2014, entitled "Hybrid Memory Module and System and Method of Operating the Same," which is incorporated herein by reference. In certain embodiments, the HV Control 330 does so by forming a data path 920 in the router 350, as shown in FIG. 9, which allows the HV Control 330 to read the page-in data stored in BufA, perform error detection and correction on the page-in data, and store the corrected page-in data back into BufA. Depending on the size of the page-in data, the HV Control 330 may separate the page-in data into portions and performs error correction on the page-in data one portion at a time by reading out each portion of the page-in data, performing error detection and correction on the each portion, and writing the corrected portion back into BufA before reading out the next portion of the page-in data for error correction.

Figure 10:
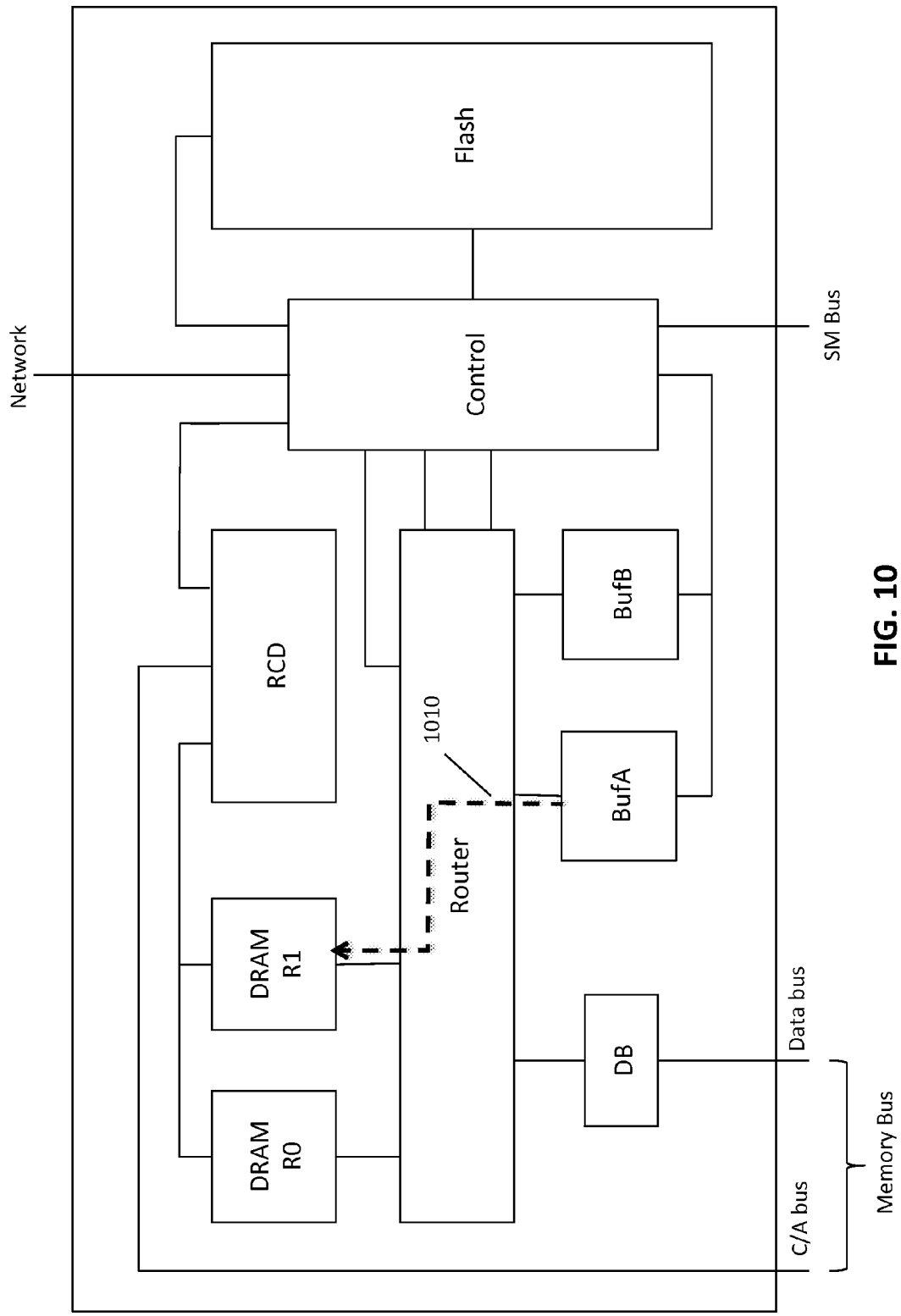

While the HVDIMM 300 is preparing for the page-in data, as described above, the HV Control 330 directs the router 350 to form a data path 930, as shown in FIG. 9, which allows the HVDIMM 330 to perform normal main memory operations in response to commands from the system. When the HV Control 330 completes the data transfers and error corrections discussed above, the HV Control 330 may send an interrupt to the HV driver 250 (725) via, for example, the SM bus. In response, the HV driver initiates a dummy write operation by causing the memory controller to send a third set of C/A signals including a write command and a write address to the HVDIMM 300. In certain embodiments, the dummy write command is like a normal write command except that it is followed with dummy data or no data from the memory controller. The third set of C/A signals are received by both the RCD and the HV Control 330. The HV Control 330 recognizes the third set of C/A signals as being part of the page fault operation because the write address is related to the address in the first or second set of C/A signals. In response, the HV Control 330 sends a read command to BufA, which causes BufA to output the page-in data. The HV Control 330 also directs the router 350 to form a data path 1010, as shown in FIG. 10, to route the page-in data to the HV-DRAM 310, which receives the page-in data in response to the C/A signals from the RCD that are derived from the third set of C/A signals. The dummy data from the memory controller is thus ignored or discarded.

In certain embodiments, normal system access to the main memory is conducted between the system and the HV-DRAM 310, without much involvement from the HV driver 350 or the HV Control 330. In certain embodiments, the memory interfaces in the computer system 100 are designed to be slave interfaces without per command handshake provision. So, the system does not have knowledge about whether any on-DIMM (intra-module) activities are occupying the DRAM input/output (I/O) pins in the HV-DRAM 310. For example, if the DRAM I/Os are being occupied for transferring data between main memory and storage, and the system (memory controller) initiates a data read or write command with the expectation that the DRAMs would be ready to execute the system command, the DRAMs would fail to execute the system read/write operation and the system would experience a 'memory failure', which may lead to a system failure.

Figure 11:
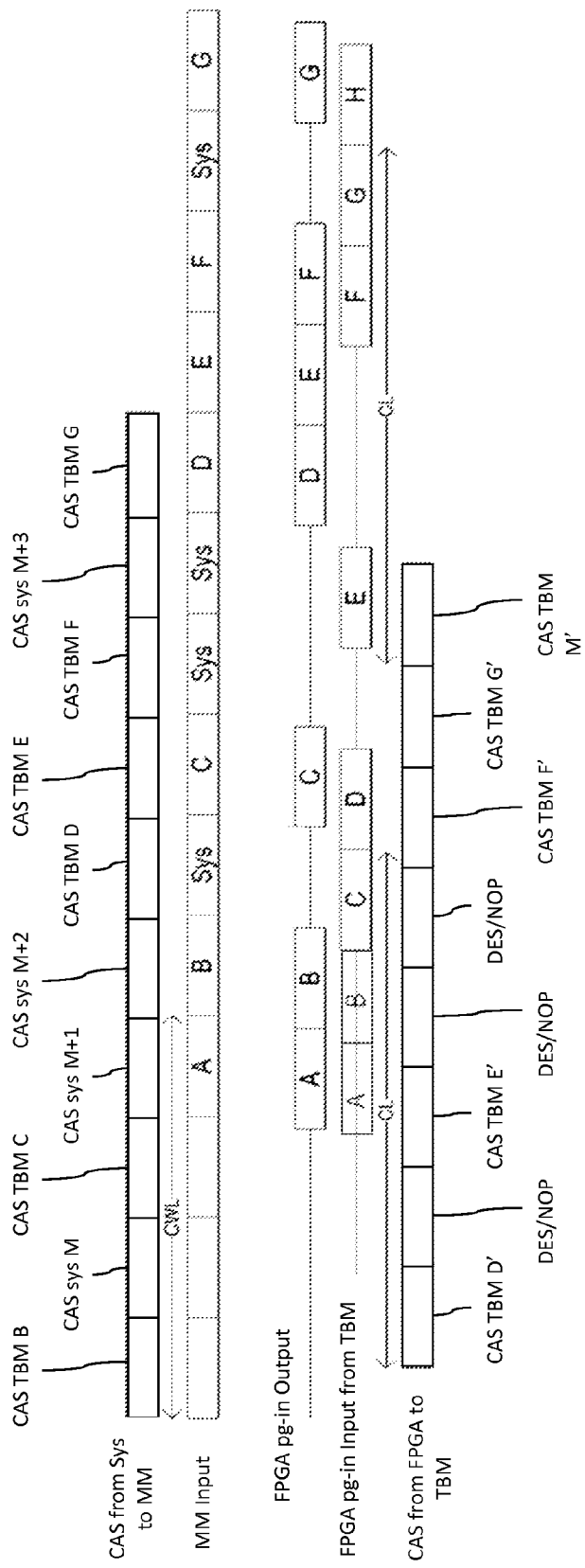
FIG. 11 is a timing diagram illustrating interleaving of page-in data flow with normal memory accesses to avoid data access conflicts according to certain embodiments

In certain embodiments, the HV Control 330 reads the page-in data from BufB and then provides the page-in data from the HV Control 330 to the HV-DRAM 310 in response to the dummy write command from the system. The HV control is confgured to monitor the memory commands from the memory controller and schedule on-DIMM (intra-module) data transfers accordingly to avoid data access conflicts. In certain embodiments, the HV Control 330 would work around system memory accesses when placing the page-in data at the DRAM I/Os, so as to avoid system failure caused by such data access conflicts. For example, as illustrated in FIG. 11, as data A thruogh G are being paged in from the buffer memory 340 (TBM) to the main memory (MM), the system may also be issuing memory access commands to write data M, M+1, M+2, M+3 into the main memory (MM). The memory controller may schedule the memory commands from the system and the dummy write commands from the HV driver 350 as follows:

CAS TBM A (not shown)—which is a dummy write command from the HV driver 350 to transfer data A from TBM to main memory (MM);

CAS TBM B—which is a dummy write command from the HV driver 350 to transfer data B from TBM to main memory (MM);

CAS sys M—which is a normal write command to write data M from system into MM;

CAS TBM C—which is a dummy write command from the HV driver 350 to transfer data C from TBM to main memory (MM);

CAS sys M+1—which is a normal write command to write data M+1 from system into MM;

CAS sys M+2—which is a normal write command to write data M+2 from system into MM;

CAS TBM D—which is a dummy write command from the HV driver 350 to transfer data D from TBM to main memory (MM);

CAS TBM E—which is a dummy write command from the HV driver 350 to transfer data E from TBM to main memory (MM);

CAS TBM G—which is a dummy write command from the HV driver 350 to transfer data G from TBM to main memory (MM);

CAS sys M+3—which is a normal write command to write data M+3 from system into MINI; and CAS TBM H (not shown)—which is a dummy write command from the HV driver 350 to transfer data H from TBM to main memory (MM).

Before the system issues the CAS TBM B command, the HV Control 330 (referred to in the figure as "FPGA") may have issued CAS TBM A', CAS TBM B', and CAS TBM C' commands to BufA to output data A, data B, and data C to the HV Control 330. The HV Control may preload data A and data B from the TBM (as shown by the data blocks A and B in the "FPGA pg-in input from TBM") and place it in the data buffer 420 in the HV Control. Afterwards, data C is output from the TBM in response to CAS TBM C' from the HV Control.

The HV Control continues to issue CAS TBM D' to the TBM when the HV Control observed the CAS sys M command from the system. In response, the HV Control issues a DES/NOP command to the TBM to pause the data transfer between the TBM and the MM. Thus, FPGA page-in (Pg-in) output is paused, as shown by the gap between data B and data C in the FPGA Pg-in output, and system data M (Sys) is received at the MM input. Afterwards, the HV Control continues to issue CAS TBM E' to the TBM when it observed CAS sys M+1 and later CAS sys M+2 from the system. In response, the HV Control issues two consecutive DES/NOP commands to pause the TBM from outputting data to the HV Control. As a result, no data is output between data E and data F from the TBM, and no data between data C and data D is driven from the HV Control to the MM, leaving a gap in the HV Control output to the MM to allow the MM to take system data M+1 and M+2 (Sys).

In certain embodiments, the HV Control 330 is further configured to perform shadowed data transfer operations between the HV-DRAM 310 and the HV-Flash 320. For example, when a system command targets a DRAM address that has been preprogrammed as an address that requires data to be transferred from the HV-Flash 320, the HV Control 330 would perform such a transfer to enable proper system access to this preprogrammed address.

In certain embodiment, the HVDIMM on the memory bus is a slave device in that it does not initiate communications with the system except through the asynchronous (e.g., I²C) interface. Thus, the system can send commands via the memory bus, but the HVDIMM 300 responds via the SM bus when sending the interrupt to the HV driver 250 to indicate completion of on-DIMM data transfers. The HV driver 250 generally takes microseconds to handle these signals. Thus, the performance of the system 100 suffers due to the relatively long handling time of asynchronous interface signals. Thus, notifying the system via asynchronous interface can cause hundreds of microseconds or more read latency.

To avoid the read latency associated with the asynchronous interface, a polling protocol can be implemented, which allows the system to periodically monitor readiness status of data transfers in the HVDIMM. Polling for the readiness status, however, may require a number of tries, and each polling activity needs to be scheduled by the system memory controller, resulting in reduction of valuable main memory bandwidth for regular memory access activities.

Figure 12:
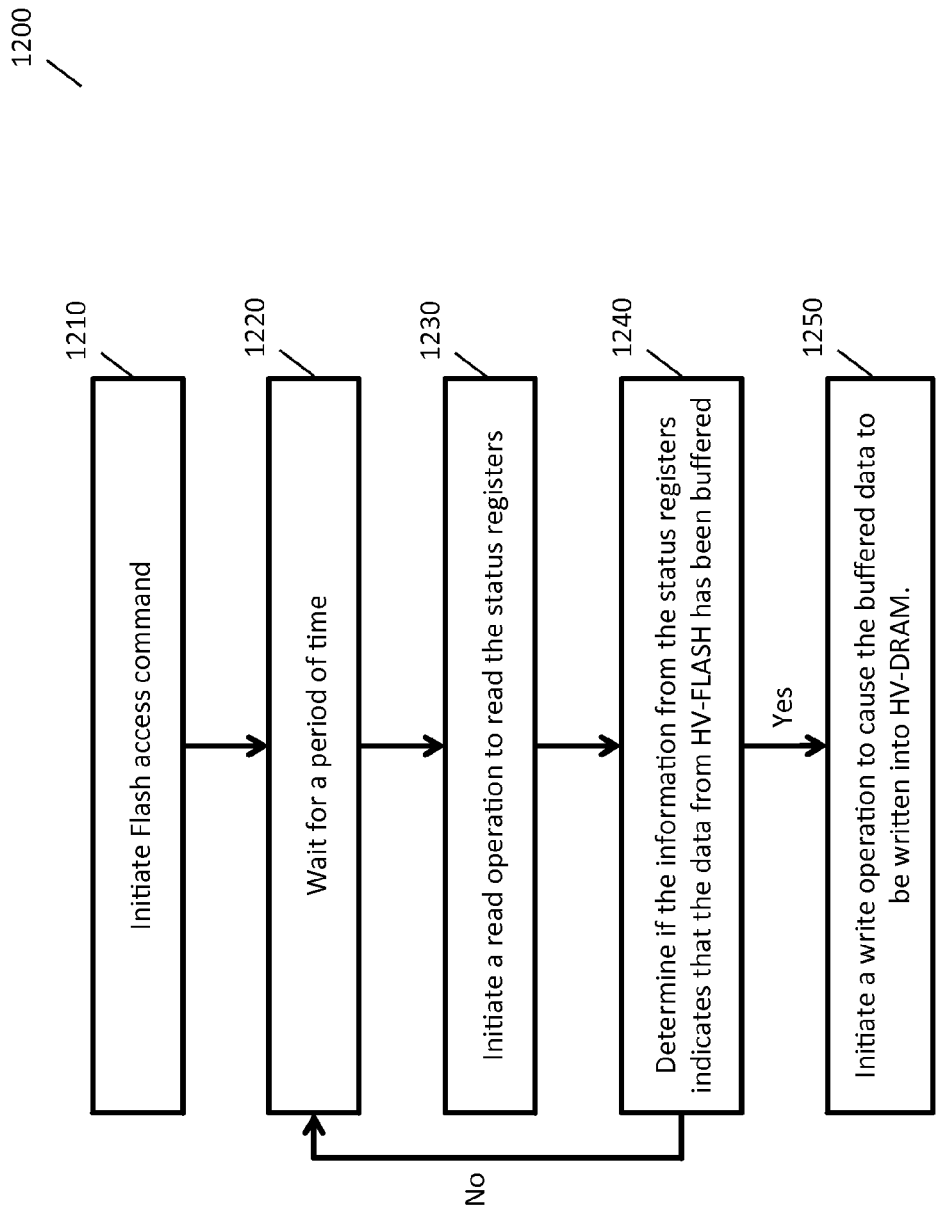
FIG. 12 is a flowchart illustrating a status report process according to certain embodiments.

In certain embodiment, the registers 440 in the HV Control 330 includes status registers to store data transfer status information, and the system (e.g., the HV driver 250) carries out a "prediction and correction" method 1200 for each storage read operation, as illustrated in FIG. 12. In certain embodiments, the HV driver 250 keeps a memory space for the status registers (i.e., the status register space), which is a virtual DRAM address space that exists in a system address space of the system 100, although there is no physical DRAM associated with it. The HV-driver initiates write or read commands to the status register space for writing into or reading from the status registers.

In certain embodiment, the prediction and correction method 1200 comprises: initiating a Flash access request (1210). This can be done by, for example, initiating a page fault operation using, for example, process 703 discussed above with reference to FIG. 7, or any other operation involving transferring data out of (or into) the HV-FLASH 320. The HV driver 330 then predicts a period of time it may take for the HVDIMM to perform the data transfers based on historical data and based on the size of the data being transferred from HV-FLASH 320. The HV driver waits for the period of time to pass (1220) before initiating a memory read operation addressed to the status registers space to read the information in the status registers (1230), and determines if the information from the status registers indicates that the data from HV-FLASH 320 has been buffered in the buffer memory 340 (1240). If the information from the status register indicates that the data has been buffered, the HV driver 250 initiates a write operation to cause the buffered data to be written into HV-DRAM (1250). Otherwise, the HV driver 250 waits an additional period of time before reading the status registers again and repeats the above process. The additional amount of time can be determined based on information from the status registers.

In certain embodiments, in response to receiving the Flash access request, the HV Control 330 receives and deciphers the data associated with the Flash access request, which includes information regarding the location of the storage data to be read from the HV-Flash 320. The HV Control 330 then issues a Flash read command to transfer the storage data from the Flash to the buffer memory 340, monitors the data transfer, and updates the information in the status registers accordingly.

In certain embodiments, the registers 440 in the HV Control 330 further comprises Flash access queue registers, or the status registers can be used as Flash access queue registers. The HV Control 330 queues Flash access requests from the system using the Flash access queue registers, and computes an "estimated wait time" for each Flash access request queued in the Flash access queue registers. The estimated wait time is updated periodically based on historical data transfer rates and the number of previously queued Flash access requests. When the data transfer from the Flash to the buffer memory 340 is completed, a ready bit is set in the status registers, and the corresponding "estimated wait time" is updated to be zero.

For example, if the storage data requested by a Flash access request is 1 MB in size, the HV controller starts a timer as it starts the data transfer. It measures how long it takes to move each of multiple 10 KB chunks of the 1 MB storage data, and calculates the average time (e.g., 1 microsecond or μsec) to move a 10 KB chunk of storage data. Based on how many 10 kB chunks are left for each data transfer, the controller calculates the remaining time for the data transfer, and updates the status registers storing the estimated wait time to reflect the remaining time as the storage data is being moved to the buffer memory 340.

For example, if there are 4 queued commands, a first command having its storage data currently being transferred, a second command for moving 1 MB of storage data, a third command for moving 2 MB of storage data, and fourth command for moving 1 MB of storage data. Assuming that the current data transfer has about 10 μsec left to complete, the estimate wait time for these commands would be:

First Command (in Queue 0)—10 μsec,
Second Command (in Queue 1)—110 μsec,
Third Command (in Queue 2)—310 μsec, and
Fourth Command (in Queue 3)—410 μsec.

Figure 13:
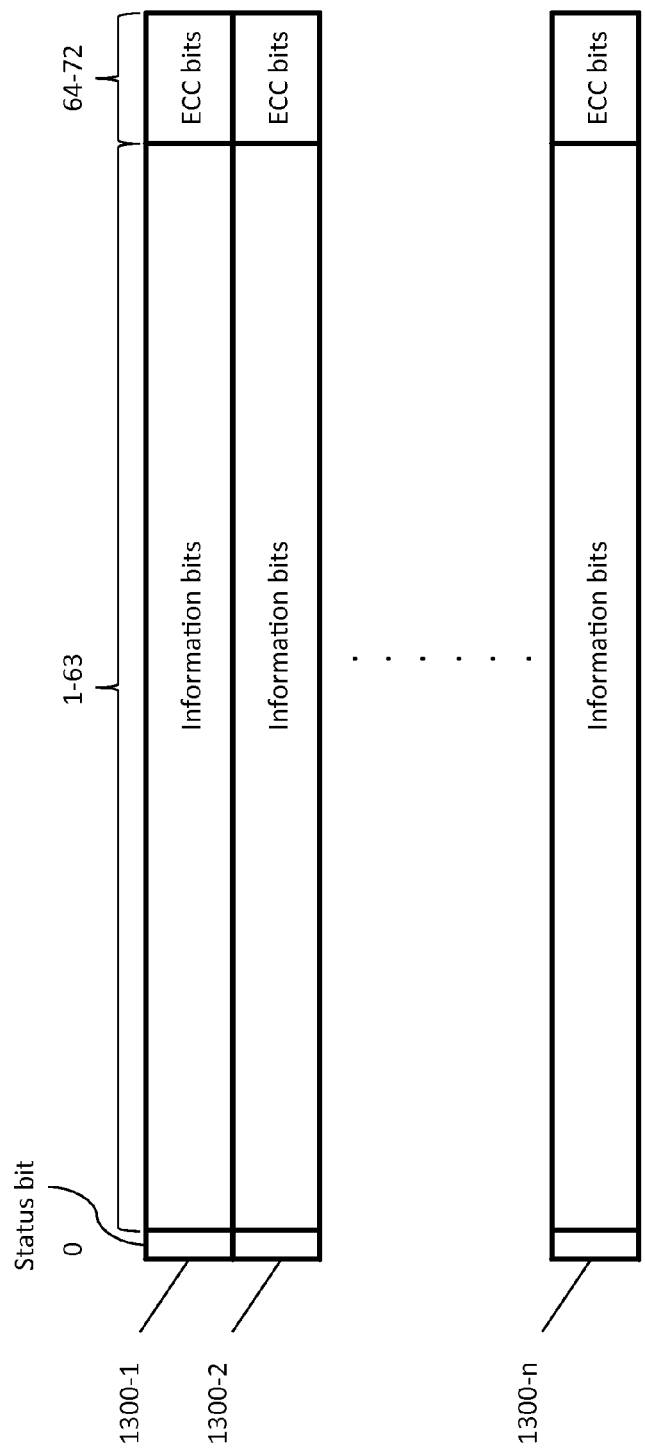
FIG. 13 is a block diagram illustrating status registers on the memory module according to certain embodiments.

These estimated wait time is stored in the status registers together with the respective ready bit, and is updated periodically (e.g., every 10 μsec). In certain embodiments, the status data for each respective command is represented by a set of status bits including a ready bit (e.g., bit 0) indicating completion of the associated data transfer and a plurality of information bits storing further status information associated with the respective command, such as the respective estimated wait time to completion, as shown in FIG. 13, which illustrates n sets of status registers, 1300-1, 1300-2, . . . , 1300-n, each for storing the status bits and associated ECC code for a respective queued command. The system knows which queued command each set of status registers represent based on the order of the queued or uncompleted commands whose data has not been read out. When the system reads the status registers, and the ready bit is set, the system can proceed to read the data from the buffer memory 340. If the ready bit is not set, the system may read the "estimated wait time", and wait for that period before issuing the read command to read the storage data or re-reading the status registers.

Thus, in the above example, if the system reads out the buffered storage data after 20 μsec, data associated with the first command should be ready and read out, while each of the other queued commands are moved up in queue with the following status information:

Second Command (in Queue 0)—90 µsec,
Third Command (in Queue 1)—290 µsec,
Fourth Command (in Queue 2)—390 µsec, and
Fifth Command (in Queue 3)—xxx.

If the system does not read out the buffered storage data for 500 µsec, then the wait time may be (after 500 µsec)

First Command (in Queue 0)—0 µsec (data is ready and the ready bit is set),
Second Command (in Queue 1)—0 µsec (data is ready and the ready bit is set),
Third Command (in Queue 2)—0 µsec (data is ready and the ready bit is set), and
Fourth Command (in Queue 3)—0 µsec (data is ready and the ready bit is set)

Thus, the system can accumulate data read out operations, and execute them all together based on the information from the status registers.

In certain embodiments, each set of status registers 1200 also includes ECC bits for storing an ECC code associated with the respective status data. An ECC-capable memory controller as used in many modern personal computers, and most medium to high-end workstation and server systems, can use the ECC code that comes with each data word to detect and correct a single-bit errors per 64-bit data word (i.e., a unit of bus transfer), and detect (but not correct) a two-bit error per 64-bit data word. The memory controller may drop the status data unless the ECC is checked out correctly.

In certain embodiments, to produce the correct ECC for the status data, the HV driver 250 causes the memory controller to write various pre-defined status code into the HVDIMM 300 that covers most or all possible status situations. The system memory controller would assert the correct ECC code prior to writing the pre-define status code to addresses assigned to the internal memory of the HV Control 330. The HV Control 330 stores each pre-defined 64-bit status code along with its ECC byte into the registers or local memories in the HV Control 330, and updates the status registers using the pre-defined status code along with its ECC code. For example, if the HV Control 330 needs to update a set of status registers for a queued Flash access request with the status information of "90 µsec estimate wait time till completion," the HV Control 330 would look up the predefined status code corresponding to this status information in its local memories and update the set of status registers with the predefined status code and its associated ECC code. When the system requests for the status of the Flash access request by reading the status register, the HV Control 330 can simply read the pre-defined status code along with the correct ECC from the status registers, and sends that out to the system.

In certain embodiments, the status registers can also be used to store other status information, such as the "healthiness of the Flash" on a HVDIMM, the remaining life time of the Flash storage, any statistical data collected during the operations, etc.

Thus, the system can avoid implementing the polling protocol and use instead a dynamic and synchronous communication interface to obtain status information from the HVDIMM 300 via the memory bus. The system also can dynamically schedule CPU activities (process queue) efficiently based on the information it gets from the status registers.

In certain embodiments, the memory controller performs ECC encoding/decoding and interleaving amongst the sockets (CPUs), channels and ranks to improve the error handling capability. The memory controller performs these operations both on address and on data. Thus, the system address and data (including the cache) has one-to-one mapping to the DIMM address space. Any particular mapping, however, is usually only valid for a particular version of server platform with a particular version of BIOS and Memory Reference Code (MRC). The Memory Reference Code (or MRC) in some computers determines how the computer's memory (RAM) will be read and written, and adjusts memory timing algorithms correctly for the effects of any modifications set by the user or computer hardware. In other words, even for a same platform, if a new version of BIOS or MRC is installed, the translation mapping is likely to become invalid. Thus, for HVDIMM 300, a designer either needs to target for a particular version of server platform and BIOS/MRC, or needs to find a way to overcome the issue associated with the uncertainty of the server platform and BIOS/MRC variation. This issue becomes more important for HVDIMMs that support a DRAM main memory space as well as a storage space since these two address spaces do not always co-exist on the memory table.

In certain embodiments, the system used a Memory Mapped I/O (MMIO) access protocol to access the storage space of the HVDIMM 300, allowing the system to distinguish the system address space from the storage space. This MMIO space may not be in the traditional MMIO system address space. For example, non-uniform memory access (NUMA) is defined in the 3.75 GB-4 GB system address. Since the system address decoder gives higher priority to target the traditional MMIO decoding for this range over the main memory address decoding, defining the MMIO space for the HVDIMM 300 in the traditional MMIO space may not work correctly. Thus, in certain embodiments, the MMIO space for the HVDIMM 300 is defined in the main memory space, and is thus different from the traditional MMIO space. For that reason, the MMIO space for the HVDIMM 300 is referred to herein as Pseudo MMIO (PMMIO) space.

In certain embodiments, to be able to access the storage space in an HVDIMM via the memory bus, the system has knowledge about which system address space actually maps to the Flash memory space 620, and tag those memory spaces as the PMMIO space for the HVDIMM.

In certain embodiments, instead of developing a generalized mapping table to embrace all the variables (i.e. the platform version, BIOS version and MRC version) mapping table, an automatically configurable mapping table is developed to provide a relationship between the system address (physical address) and the DIMM address for a particular system that contains one or more HVDIMMs.

The automatically configurable mapping table contains the DIMM and Rank numbers that associate with the system address. This mapping table can be a set of arithmetic expression of a mapping or actual look up table, and is built on the fact that the address relationship (one-to-one) does not alter while a system is in operation. This also means that the table can be configured during boot-up and initialization period, and will be valid though out the operation.

In certain embodiments, the following procedures are employed to configure the mapping or lookup table:

Set up a DIMM population rule;
In an on-DIMM serial presence detect (SPD) device, code the DIMM density bigger than the actual DRAM density (e.g., for a DIMM with 8 GB DRAM density, the SPD is configured as a 16 GB DIMM);

Read the BIOS/MRC registers for interleaving, offset configuration;

Reverse map the DIMM address into the system address; and

Mark the address space for the non-existent DRAM space as reserved space for PMMIO operations, thus creating a Flash access address space.

This reserved space is not likely a contiguous system address space due to the socket, channel and rank interleaving. The HV driver 250 uses this reserved address space as the PMMIO space for the particular HVDIMM. The HV Control 330 recognizes any address targeting the Flash access address space as the MMIO command access, and deciphers the associated data as the MMIO command.

The Flash access space on the DIMM can be used to support any data transfer between the HV-FLASH and the system. It also helps to support on DIMM data transfer between the main memory DRAM and the Flash without going through the buffer in the CPU. This can be done by building a memory association table that maps system addresses to the associated DIMM locations along with the physical HV-FLASH locations. The association table can be stored as one of the lookup tables 260, as shown in FIG. 2 and accessible by the HV driver 250.

Figure 14:
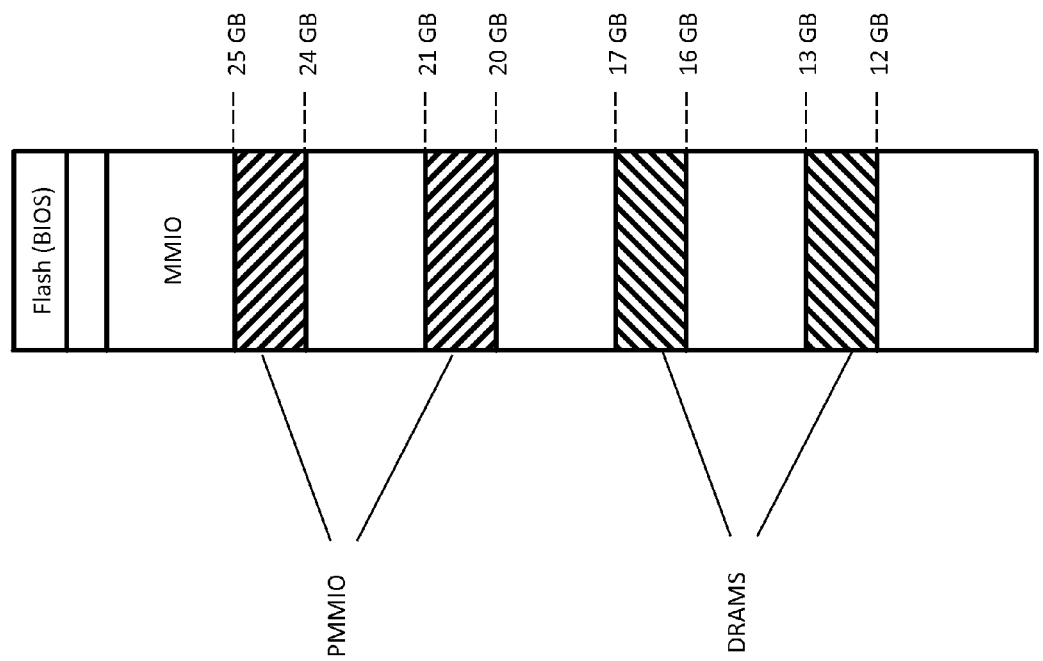
FIG. 14 is a block diagram illustrating a system memory address space in the computer or server system according to certain embodiments.

For example, as shown in FIG. 14, the system address for the DRAMs on Socket (CPU) 0, Channel 0, HVDIMM 0 is reverse mapped to 12 GB-13 GB and 16 GB-17 GB. The PMMIO space for the same HVDIMM is mapped to system address space 20 GB-21 GB and 24 GB-25 GB. The system can associate these address spaces such that data can be transferred between the PMMIO space 20 GB-21 GB/24 GB-25 GB and the DRAM space 12 GB-13 GB/16 GB-17 GB.

One effective use of this association mapping is that the main memory data (DRAM) swap space can be built into the HVDIMM on the same DIMM, and the data swap can occur directly without any involvement of the buffer in CPU. This also allows swapping (e.g., page-in or page-out) very large data size without overhead by executing on-DIMM direct data transaction, as discussed above with reference to FIGS. 7-10.

Thus, the storage in the HVDIMM 300 can be efficiently used without being limited to a particular sever platform or BIOS or MRC.

We claim:

1. A memory module for use in a computer system, the computer system including a memory controller coupled to the memory module via a memory channel, the memory channel including a data bus and a control/address (C/A) bus, comprising:
 a volatile memory subsystem coupled to the memory channel, the volatile memory subsystem including a registered control device (RCD) configured to receive input C/A signals from the C/A bus and memory devices configured to perform memory operations in response to output C/A signals from the RCD that are derived from the input C/A signals;
 a non-volatile memory subsystem; and
 a module control device coupled to the volatile memory subsystem, the non-volatile memory subsystem, and the memory channel, wherein the module control device is configured to perform a page-fault operation in response to a set of signals received from the memory channel indicating a non-volatile memory access request to transfer first data from the non-volatile memory subsystem to the volatile memory subsystem, the page fault operation including reading the first data from the non-volatile memory subsystem in response to the set of signals, and providing at least a portion of the first data to the volatile memory subsystem in response to a dummy write memory command received via the C/A bus, the dummy write memory command being received by both the module control device and the RCD and including a memory address related to the page-fault operation.

2. The memory module of claim 1, further comprising buffer memory, wherein the module control device is further configured to, as part of the page fault operation, store the first data into the buffer memory after reading the first data from the non-volatile memory subsystem and send a read command to the buffer memory to cause the buffer memory to output another portion of the first data after receiving the dummy write memory command; wherein the volatile memory subsystem is configured to receive the at least a portion of the first data in response to the dummy write memory command, and wherein the volatile memory subsystem, the non-volatile memory subsystem, the module control device and the buffer memory are mounted on a same printed circuit board.

3. The memory module of claim 2, wherein the module control device is configured to read second data from the volatile memory subsystem in response to the set of signals indicating the non-volatile memory access request, wherein the buffer memory includes a first memory and a second memory, wherein the module control device is further configured to write the first data into the first memory concurrently with writing the second data into the second memory.

4. The memory module of claim 3, wherein the module control device is configured to perform error correction on the first data stored in the first memory by reading data from the first memory, performing error detection and correction on data read from the first memory, and storing corrected data back into the first memory, and wherein the module control device is further configured to transfer the second data from the second memory to the non-volatile memory subsystems concurrently with performing error correction on the first data stored in the first memory.

5. The memory module of claim 1, wherein the set of signals indicating the non-volatile memory access request include a set of C/A signals received via the C/A bus and a set of data signals received via the data bus, the set of data signals including information about one or more locations in the non-volatile memory subsystem.

6. The memory module of claim 2, wherein the module control device includes status registers accessible by the computer system via the memory channel, the status registers for storing therein status bits for the non-volatile memory access request, and wherein the module control device is further configured to, as part of the page fault operation, provide the status bits to the memory controller via the memory channel in response to a read command and a read address received from the memory controller, the read address being in an address space assigned to the status registers.

7. The memory module of claim 6, wherein the status registers is further configured to store an ECC code associated with the status bits, and wherein the module control device provides the ECC code along with the status bits.

8. The memory module of claim 6, wherein the status bits include information regarding an estimated wait time for the first data to be stored into the buffer memory.

9. The memory module of claim 1, wherein the at least a portion of the first data includes a first portion of the first data, wherein the memory devices in the volatile memory subsystem include double data rate dynamic random access memory devices, wherein the memory module is configured to receive a normal write memory command via the C/A bus after receiving the dummy write memory command, and to receive write data via the data bus in response to the normal write memory command, and wherein the module control device is further configured to cause a second portion of the first data to be written into the volatile memory subsystem in response to another dummy write memory command received after the normal write memory command.

10. The memory module of claim 9, further comprising a serial presence detect device coded with a memory density bigger than a memory density of the volatile memory subsystem thereby allowing for a non-volatile memory access address space that is outside a memory address space for the volatile memory subsystem, wherein the non-volatile memory access request includes an address in the non-volatile memory access address space.

11. A method of operating a memory module in a computer system, the computer system including a memory controller coupled to the memory module via a memory channel, the memory channel including a data bus and a control/address (C/A) bus, the method comprising:
receiving, by a module control device on the memory module, a set of signals from the memory controller via the memory channel; and
performing a page fault operation in response to the set of signals indicating a non-volatile memory access request to transfer first data from a non-volatile memory subsystem on the memory module to a volatile memory subsystem on the memory module, the page fault operation including:
reading first data from the non-volatile memory subsystem in response to receiving the set of signals;
receiving, by the module control device, a dummy write memory command via the C/A bus, the dummy write memory command including an address related to the page-fault operation; and
providing at least a portion of the first data to the volatile memory subsystem in response to the dummy write memory command, wherein the volatile memory subsystem includes a registered control device (RCD) configured to receive the dummy write memory command via the C/A bus, and wherein the volatile memory subsystem is configured to receive the at least a portion of the first data in response to the dummy write memory command.

12. The method of claim 11, wherein the memory module further includes buffer memory, wherein the page-fault operation further includes: storing the first data into the buffer memory after reading the first data from the non-volatile memory subsystem, and causing the buffer memory to output another portion of the first data after receiving the dummy write memory command.

13. The method of claim 12, wherein the buffer memory includes first memory and a second memory, the method further comprising:
reading second data from the volatile memory subsystem in response to the set of signals indicating the non-volatile memory access request; and
writing the first data into the first memory concurrently with writing the second data into the second memory.

14. The method of claim 13, further comprising:
transferring the second data from the second memory to the non-volatile memory subsystems; and
performing error correction on the first data stored in the first memory concurrently with transferring the second data from the second memory to the non-volatile memory subsystems;
wherein performing error correction comprises reading data from the first memory, performing error detection and correction on data read from the first memory, and storing corrected data back into the first memory.

15. The method of claim 11, wherein receiving the set of signals indicating the non-volatile memory access request includes receiving a set of C/A signals via the C/A bus and receiving a set of data signals via the data bus, the set of data signals including information about one or more locations in the non-volatile memory subsystem.

16. The method of claim 12, further comprising, as part of the page-fault operation, storing status information for the non-volatile memory access request, and providing the status information to the memory controller via the memory channel in response to a read command for reading the status information.

17. The method of claim 16, further comprising storing an ECC code associated with the status information, and providing the ECC code along with the status information.

18. The method of claim 16, wherein the status information includes information regarding an estimated wait time for the first data to be stored into a buffer memory before being written into the volatile memory subsystem.

19. The method of claim 11, wherein the at least a portion of the first data includes a first portion of the first data, and wherein the volatile memory subsystem includes double data rate dynamic random access memory, the method further comprising: receiving a normal write memory command via the C/A bus after receiving the dummy write memory command; receiving at the volatile memory subsystem write data via the data bus in response to the normal write memory command; receiving an additional dummy write memory command via the C/A bus after receiving the normal write memory command; and causing a second portion of the first data to be written into the volatile memory subsystem in response to the additional dummy write memory command.

20. The method of claim 19, further comprising coding a serial presence detect device with a memory density bigger than a memory density of the volatile memory subsystem thereby allowing for a non-volatile memory access address space that is outside a memory address space for the volatile memory subsystem, wherein the non-volatile memory access request includes an address in the non-volatile memory access address space.

21. The memory module of claim 1, wherein the volatile memory subsystem is configured to receive the at least a portion of the first data in response to the dummy write memory command.

22. The memory module of claim 21, further comprising a printed circuit board, wherein the volatile memory subsystem, the non-volatile memory subsystem, and the module control device are mounted on the printed circuit board.

23. The memory module of claim 22, further comprising buffer memory configured to buffer the first data, wherein the module control device is further configured to, before receiving the dummy write memory command, send a first read command to the buffer memory to output the at least a portion of the first data.

24. The memory module of claim 23, wherein the module control device is further configured to send a second read command to the buffer memory to cause the buffer memory to output another portion of the first data after receiving the dummy write memory command, and wherein the module control device is further configured to monitor memory commands on the C/A bus while the first data is being transferred to the volatile memory subsystem, and to send a pause command to the buffer memory in response to receiving a normal memory command for system access to the volatile memory subsystem via the C/A bus.

25. The memory module of claim 23, wherein the module control device is configured to perform error correction on the first data after storing the first data into the buffer memory and before sending the read command to the buffer memory to output the at least a portion of the first data in response to the dummy write memory command, and wherein the module control device is configured to perform the error correction on the first data stored in the buffer memory by reading data from the buffer memory, performing error detection and correction on data read from the buffer memory, and storing corrected data back into the buffer memory.

\* \* \* \* \*